(12) United States Patent
Mischitz et al.

(10) Patent No.: US 10,373,868 B2
(45) Date of Patent: Aug. 6, 2019

(54) METHOD OF PROCESSING A POROUS CONDUCTIVE STRUCTURE IN CONNECTION TO AN ELECTRONIC COMPONENT ON A SUBSTRATE

(71) Applicant: Infineon Technologies Austria AG, Villach (AT)

(72) Inventors: Martin Mischitz, Wernberg (AT); Markus Heinrici, Villach (AT); Michael Roesner, Villach (AT); Oliver Hellmund, Neubiberg (DE); Caterina Travan, Villach (AT); Manfred Schneegans, Vaterstetten (DE); Peter Irsigler, Obernberg am Inn (AT); Friedrich Kroener, Villach (AT)

(73) Assignees: INFINEON TECHNOLOGIES AUSTRIA AG, Villach (AT); TECHNISCHE UNIVERSITAET GRAZ, Graz (AT)

( * ) Notice: Subject to any disclaimer, the term of this patent is extended or adjusted under 35 U.S.C. 154(b) by 0 days.

(21) Appl. No.: 14/997,601

(22) Filed: Jan. 18, 2016

(65) Prior Publication Data
US 2017/0207123 A1    Jul. 20, 2017

(51) Int. Cl.
*H01L 21/78*    (2006.01)
*H01L 23/00*    (2006.01)

(52) U.S. Cl.
CPC .............. *H01L 21/78* (2013.01); *H01L 24/03* (2013.01); *H01L 24/94* (2013.01);
(Continued)

(58) Field of Classification Search
CPC ......... H01L 21/78; H01L 24/03; H01L 24/64; H01L 2224/03312; H01L 2224/03318;
(Continued)

(56) References Cited

U.S. PATENT DOCUMENTS

| 9,190,322 B2 | 11/2015 | Mischitz et al. |
| 2010/0029045 A1* | 2/2010 | Ramanathan ......... H01L 21/565 438/114 |
| 2010/0309060 A1* | 12/2010 | Harihara ................ H01Q 1/243 343/700 MS |
| 2012/0211764 A1* | 8/2012 | Okamoto .......... H01L 23/49513 257/76 |

(Continued)

FOREIGN PATENT DOCUMENTS

| DE | 10339487 B4 | 3/2007 |
| DE | 102015100665 A1 | 7/2015 |

*Primary Examiner* — Brigitte A Paterson
(74) *Attorney, Agent, or Firm* — Viering, Jentschura & Partner mbB

(57) ABSTRACT

According to various embodiments, a method for processing a substrate may include: processing a plurality of device regions in a substrate separated from each other by dicing regions, each device region including at least one electronic component; wherein processing each device region of the plurality of device regions includes: forming a recess into the substrate in the device region, wherein the recess is defined by recess sidewalls of the substrate, wherein the recess sidewalls are arranged in the device region; forming a contact pad in the recess to electrically connect the at least one electronic component, wherein the contact pad has a greater porosity than the recess sidewalls; and singulating the plurality of device regions from each other by dicing the substrate in the dicing region.

20 Claims, 19 Drawing Sheets

(52) U.S. Cl.
CPC ............. *H01L 2224/03312* (2013.01); *H01L 2224/03318* (2013.01); *H01L 2224/03332* (2013.01); *H01L 2224/03462* (2013.01); *H01L 2224/03622* (2013.01); *H01L 2224/05139* (2013.01); *H01L 2224/05144* (2013.01); *H01L 2224/05147* (2013.01); *H01L 2224/05155* (2013.01); *H01L 2224/29111* (2013.01); *H01L 2224/29116* (2013.01)

(58) Field of Classification Search
CPC . H01L 2224/03332; H01L 2224/03462; H01L 2224/03622; H01L 2224/05139; H01L 2224/05144; H01L 2224/05147; H01L 2224/05155; H01L 2224/0311
See application file for complete search history.

(56) References Cited

U.S. PATENT DOCUMENTS

| | | | |
|---|---|---|---|
| 2012/0252164 A1* | 10/2012 | Nakao | H01L 21/76898 438/107 |
| 2013/0001775 A1* | 1/2013 | Nishikubo | H01L 24/13 257/737 |
| 2013/0256894 A1* | 10/2013 | Adema | H01L 24/27 257/762 |
| 2014/0268616 A1* | 9/2014 | Lan | H01L 23/49822 361/782 |
| 2015/0065606 A1* | 3/2015 | Matsuda | C08L 63/00 523/201 |
| 2015/0214095 A1 | 7/2015 | Mischitz et al. | |

* cited by examiner

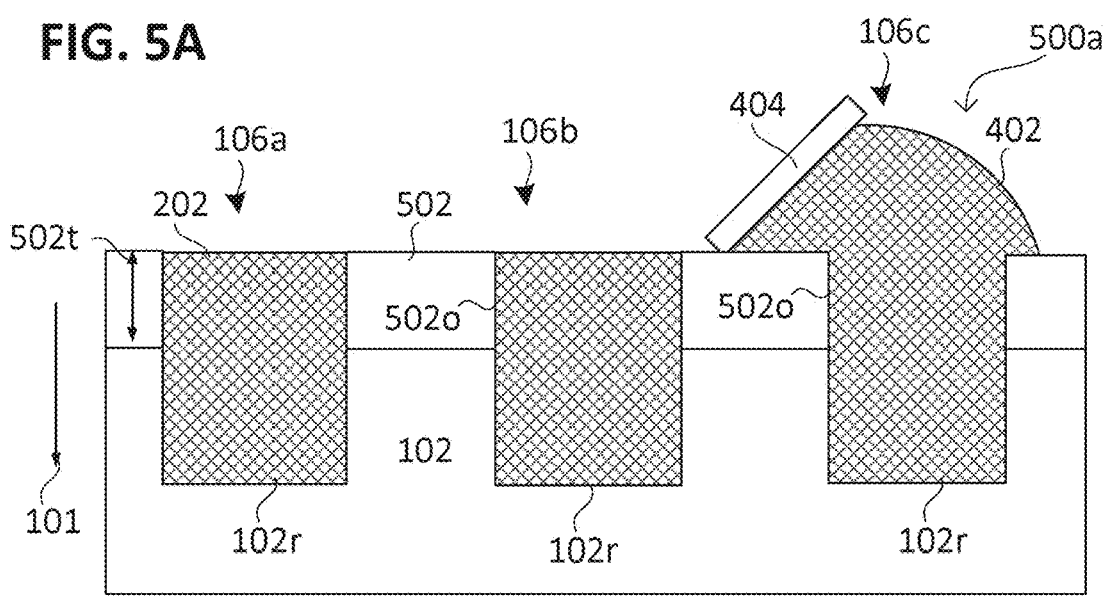
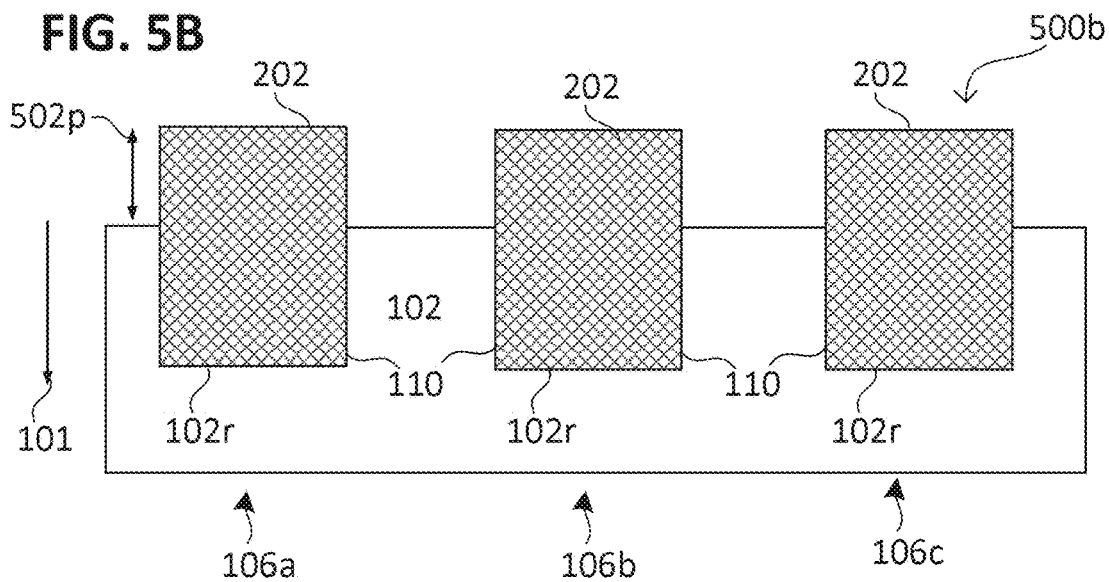
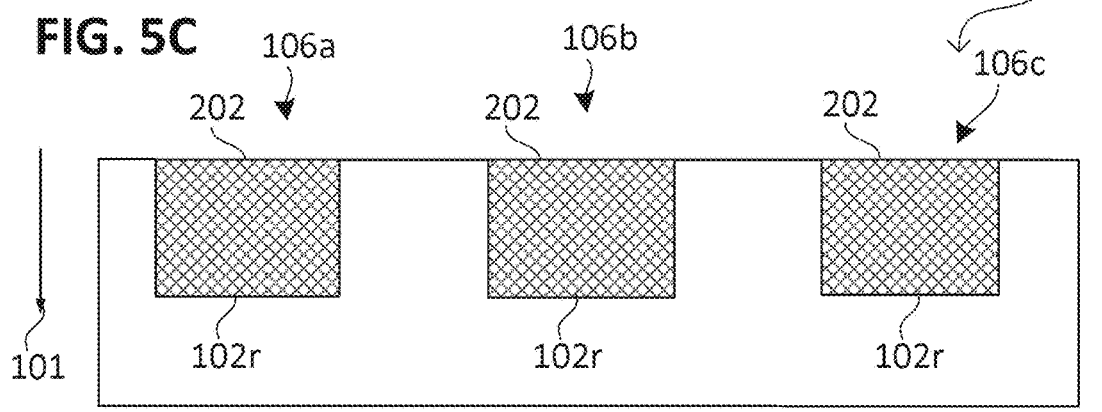

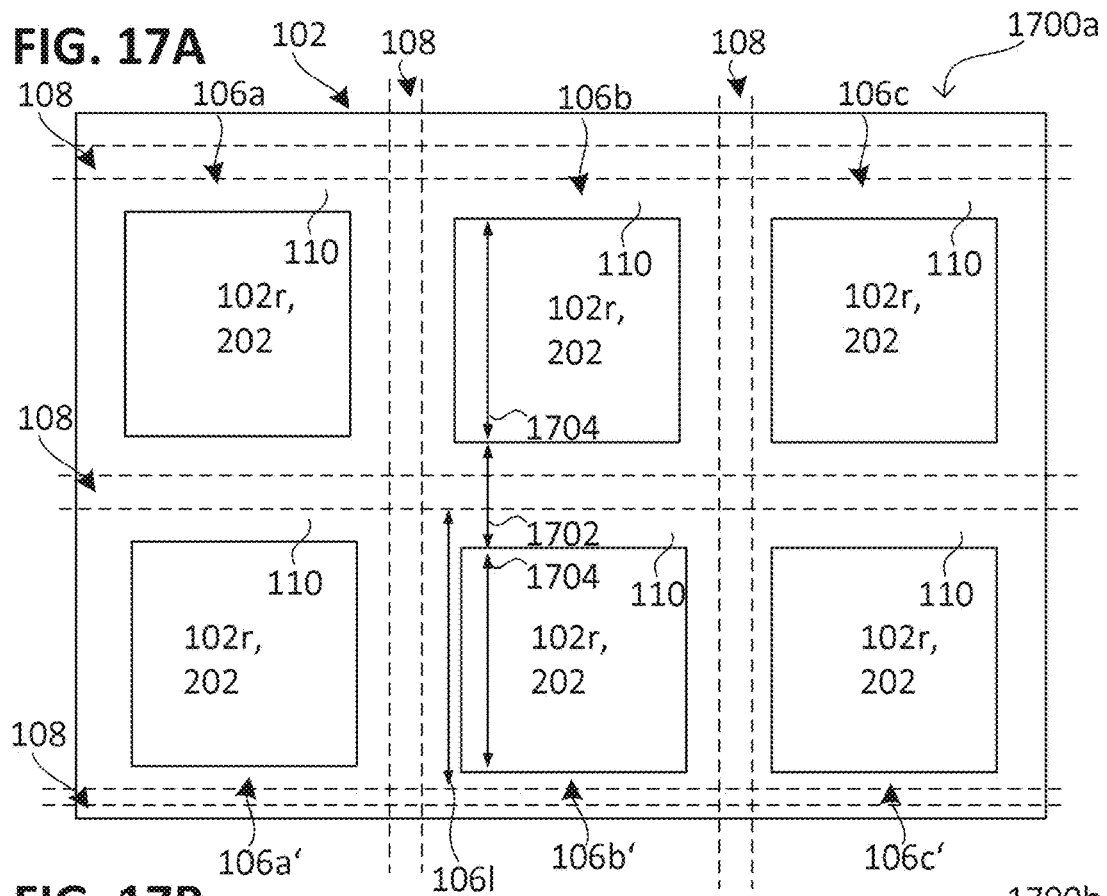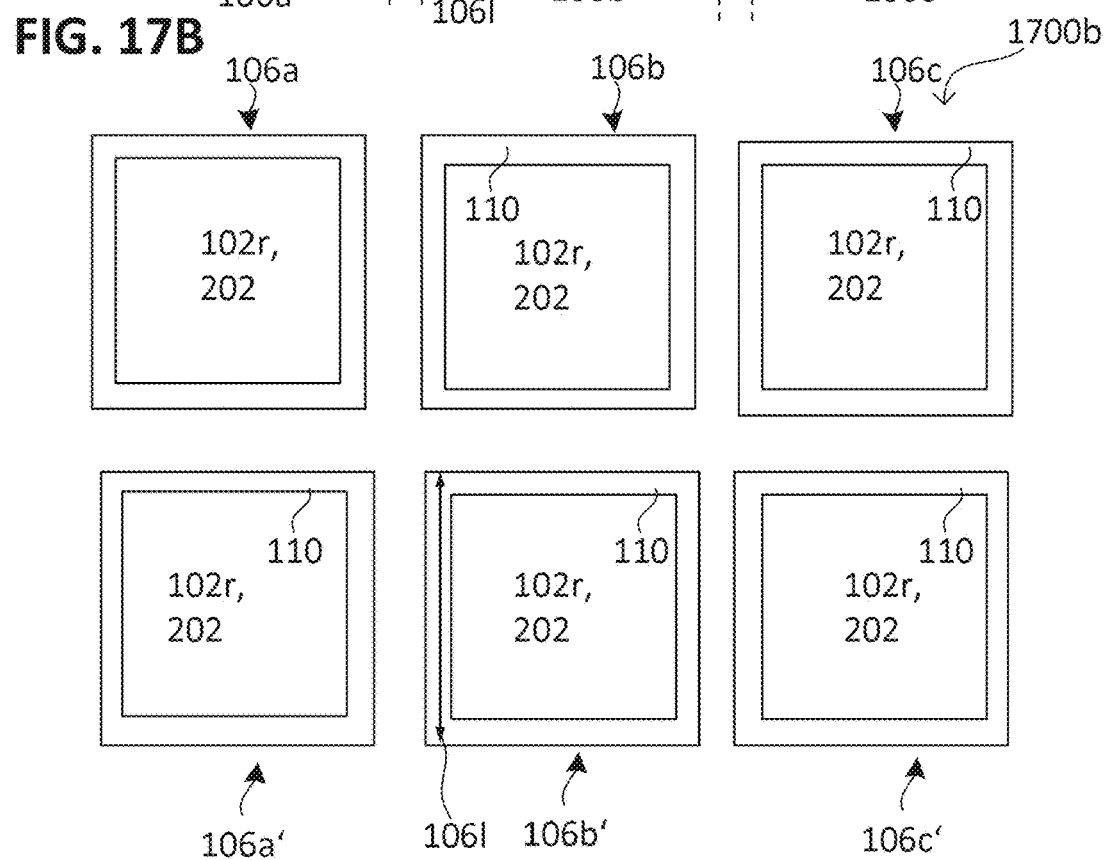

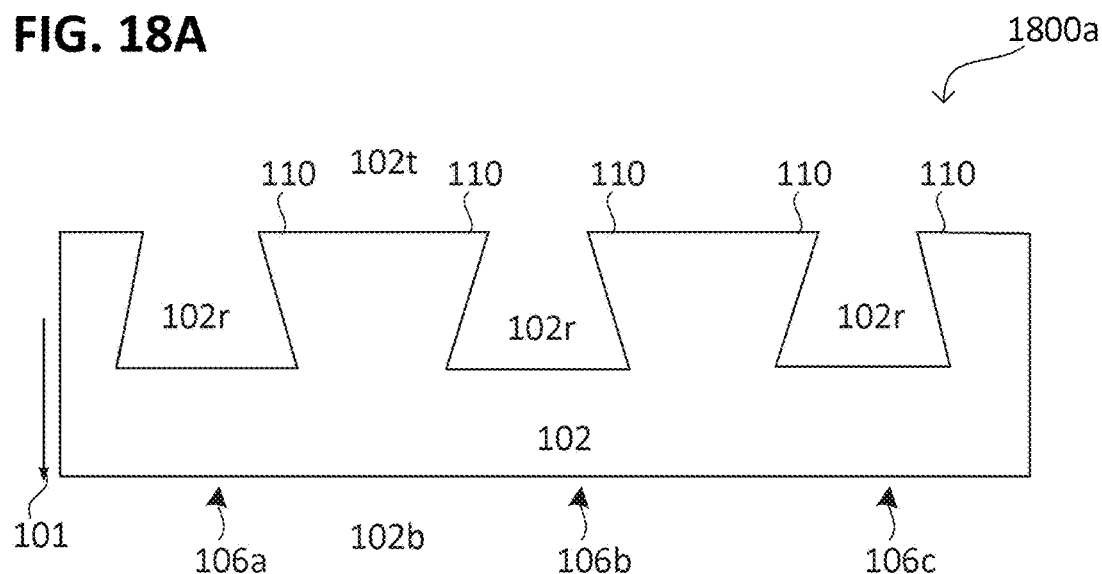
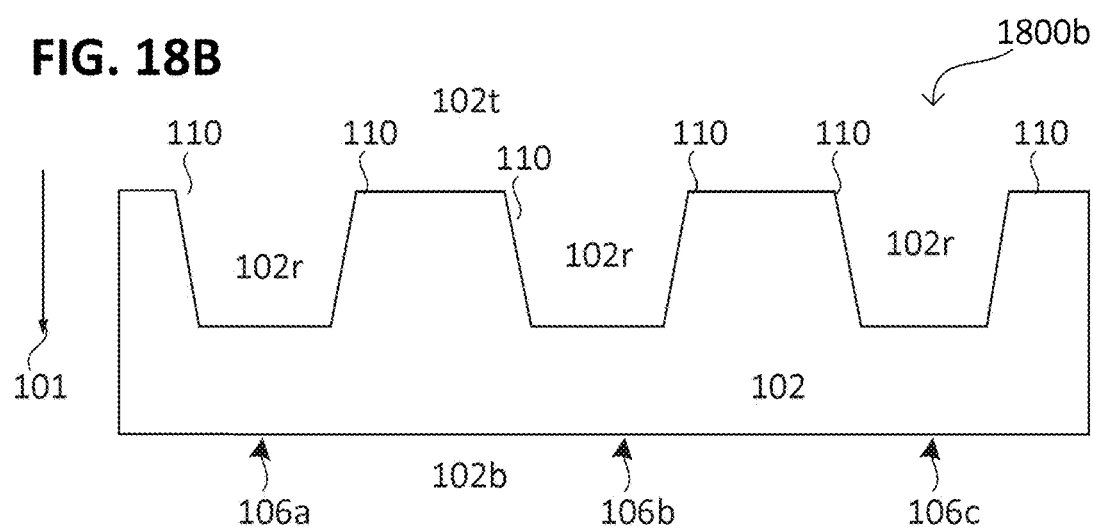
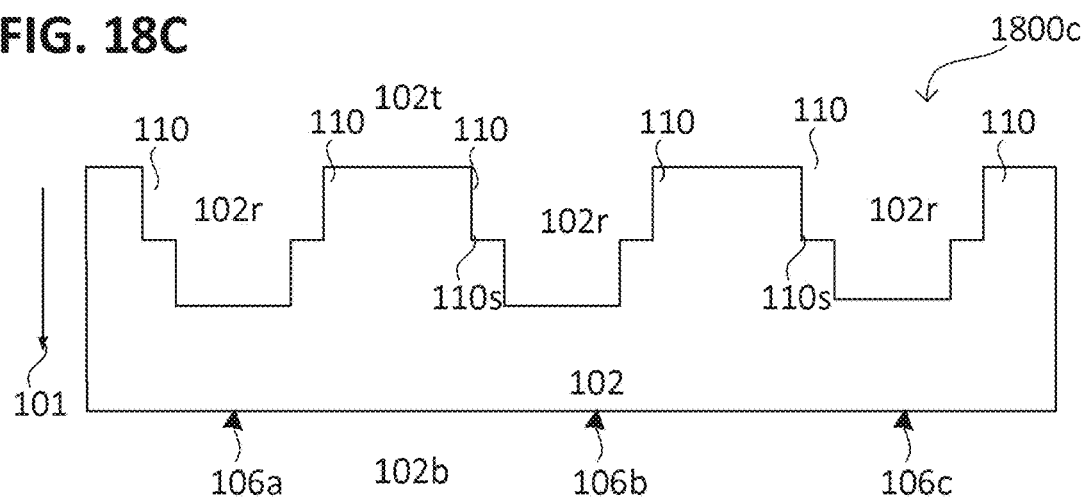

US 10,373,868 B2

METHOD OF PROCESSING A POROUS CONDUCTIVE STRUCTURE IN CONNECTION TO AN ELECTRONIC COMPONENT ON A SUBSTRATE

TECHNICAL FIELD

Various embodiments relate generally to a method for processing a substrate and to an electronic device.

BACKGROUND

In general, semiconductor materials may be processed in semiconductor technology on or in a substrate (also referred to as a wafer or a carrier), e.g. to fabricate integrated circuits (also referred to as chips). During processing of the semiconductor material, certain processes may be applied, such as forming one or more layers over the substrate, structuring the one or more layers, or contacting the readily fabricated chips.

Conventionally, the sheet resistance of the chip may be reduced by reducing a thickness of the semiconductor material (e.g. silicon). By way of example, for a junction field effect transistor (SFET) a reduction of the thickness of the semiconductor material from 40 µm to 20 µm may result in a decrease of the thickness of the sheet resistance by about 50%. However, reducing the thickness of the semiconductor material increases the vulnerability of the chip to cracking or bending during following processing steps.

To increase the fracture strength of a chip, e.g. for backend processing, a chip-taiko-rim is used, which stabilizes the chip by a thicker rim of the chip made of semiconductor material proximate the kerf and outside the active area of the chip. The active chip area may be selectively thinned to a predetermined thickness. The resulting cavity in the active chip area is filled by a backside metallization, e.g. by electroplating copper, which is time and cost intensive. Furthermore, the copper and the semiconductor material have different thermal expansion coefficients inducing thermomechanical load into the chip, which may increase a failure risk of the readily processed chips. Alternatively, a solder material is used to fill the cavity. The solder material may reduce the manufacturing effort at costs of an increased electrical resistance (more than 12 µOhm·cm in comparison to 1.8 µOhm·cm for copper) and an increased thermal resistance as well as reduced thermal capacity in comparison to copper.

SUMMARY

According to various embodiments, a method for processing a substrate may include: processing a plurality of device regions in a substrate separated from each other by dicing regions, each device region including at least one electronic component; wherein processing each device region of the plurality of device regions includes: forming a recess into the substrate in the device region, wherein the recess is defined by recess sidewalls of the substrate, wherein the recess sidewalls are arranged in the device region; forming a contact pad in the recess to electrically connect the at least one electronic component, wherein the contact pad has a greater porosity than the recess sidewalls; and singulating the plurality of device regions from each other by dicing the substrate in the dicing region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5A to 5C respectively show an electronic device according to various embodiments during processing in a method according to various embodiments in a schematic cross sectional view or side view;

FIGS. 17A and 17B respectively show an electronic device according to various embodiments during processing in a method according to various embodiments in a schematic cross sectional view or top view;

FIG. 18A to 18C respectively show an electronic device according to various embodiments during processing in a method according to various embodiments in a schematic cross sectional view or side view;

DESCRIPTION

Figure 1A:
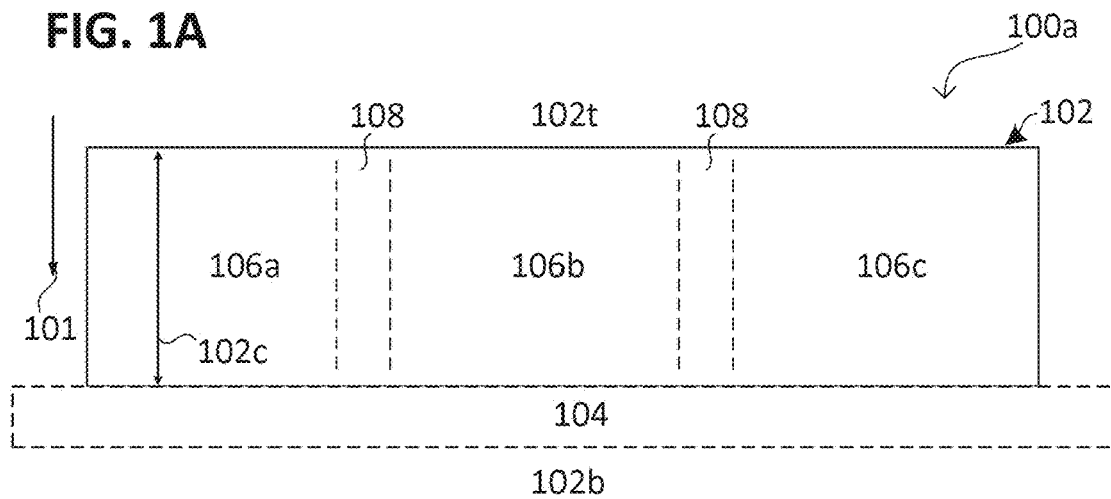
FIG. 1A to 1C respectively show an electronic device according to various embodiments during processing in a method according to various embodiments in a schematic cross sectional view or side view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, at least one of a substrate and a semiconductor region may include or be formed from a semiconductor material of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, at least one of the substrate and the semiconductor region is made of silicon (doped or undoped), in an alternative embodiment, at least one of the substrate and the semiconductor region is a silicon on insulator (SOI) wafer. As an alternative, any other suitable semiconductor material can be used for at least one of the substrate and the semiconductor region, for example a semiconductor compound material such as gallium phosphide (GaP), indium phosphide (InP), but also any suitable ternary semiconductor compound material or quaternary semiconductor compound material such as indium gallium arsenide (InGaAs).

According to various embodiments, at least one of the substrate and the semiconductor region may be processed to form one or more electronic devices (e.g. one or more semiconductor chips) at least one of in or over at least one of the substrate and the semiconductor region, e.g. in corresponding device regions. An electronic device may include an active chip area. The active chip area may be disposed in a portion of at least one of the substrate and the semiconductor region and may include one or more semiconductor components, e.g. electronic components (e.g. semiconductor circuit elements) like a transistor, a resistor, a capacitor, a diode or the like. The one or more semiconductor components (e.g. electronic components) may be configured to perform computing or storage operations. Alternatively or additionally, the one or more semiconductor components (e.g. electronic components) may be configured to perform switching or rectifying operations, e.g. in power electronics.

According to various embodiments, an electronic device may be singulated from at least one of the substrate and the semiconductor region, e.g. by removing material from a dicing region of at least one of the substrate and the semiconductor region (may also be referred to as kerf region or cutting region). By way of example, removing material from the dicing region may be processed by at least one of laser irradiation, scribing and breaking, cleavage, blade dicing or mechanical sawing (e.g. using a dicing saw). After singulating the electronic device, it may be electrically contacted and encapsulated, e.g. by mold materials, into a device carrier (also called a chip packaging) which may then be suitable for use in electronic circuits. By way of example, the electronic device may be soldered onto at least one of a chip carrier and a printed circuit board including at least one electronic circuit.

According to various embodiments, a metallic material may include or be formed from at least one chemical element of the following group of chemical elements (also referred to as metals), such as tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V), titanium (Ti), palladium (Pd), or zirconium (Zr) or an metal alloy including at least one chemical element of the group of chemical elements. By way of example, a metal alloy may include or be formed from at least two a metals (e.g. two or more than two metals, e.g. in the case of an intermetallic compound) or at least one metal (e.g. one or more than one metal) and at least one other chemical element (e.g. a non-metal or a half metal). By way of example, a metal alloy may include or may be formed from at least one metal and at least one non-metal (e.g. carbon (C) or nitrogen (N)), e.g. in the case of steel or a nitride. By way of example, a metal alloy may include or may be formed from more than one metal (e.g. two or more metals), e.g. various compositions of gold with aluminum, various compositions of copper with aluminum, various compositions of copper and zinc (e.g. "brass") or an various compositions of copper and tin (e.g. "bronze"), e.g. including various intermetallic compounds. According to various embodiments, a metallic material may be electrically conductive.

A semiconductor material, layer, region or the like may be understood as having moderate electrical conductivity, e.g. an electrical conductivity (measured at room temperature and constant electric field direction, e.g. constant electric field) in the range from about $10^{-6}$ Sievert per meter (S/m) to about $10^6$ S/m. An electrically conductive material (e.g. a metallic material), layer, region or the like may be understood as having high electrical conductivity, e.g. an electrical conductivity (measured at room temperature and constant electric field direction, e.g. constant electric field) greater than about $10^6$ S/m, e.g. greater than about $10^7$ S/m. An electrically insulating material, layer, region or the like may be understood as having a high electrical conductivity, e.g. an electrical conductivity (measured at room temperature and constant electric field direction, e.g. constant electric field) less than about $10^{-6}$ S/m, e.g. less than about $10^{-10}$ S/m.

According to various embodiments, a chip-taiko-rim (thick rim of the chip including or formed from semiconductor material proximate the dicing region and outside the active area of the chip) is formed to stabilize the chip. The active chip area may be selectively thinned to a predetermined thickness thereby forming a recess surrounded by the chip-taiko-rim. The resulting recess in the active chip area is filled by a backside metallization, e.g. by porous copper, to provide a backside contact pad.

According to various embodiments, a filling for the recess of a chip-taiko structure (also referred to as chip-taiko-frame) is provided which reduces thermomechanical stress and manufacturing effort. The filling may combine beneficial properties of the chip-taiko structure and a printing process, e.g. a paste printing process. A paste may be deposited fast and cost effective by the printing process, e.g. by stencil printing, selectively or full area over the recess (also referred to as cavity). The paste may be tempered, e.g. using a furnace. The paste may be tempered in a chemically reductive atmosphere, e.g. including gaseous formic acid. By tempering, the paste may be transferred into a metallic solid (also referred to as metallic material), in other words, including metallic properties like at least one of high electrical conductivity, ductility and high thermal conductivity, e.g. greater than one or more thereof of the semiconductor material). The metallic solid (e.g. copper) may be porous, By way of example, include a porosity greater than the semiconductor material.

By an optional second printing process, e.g. by stencil printing, a solder paste (paste including solder material) may be deposited over the metallic solid. The solder material may be heated (and at least partially melted), e.g. using a reflow process, to adhere the solder material to the metallic solid. The solder material may partially flow into pores of the metallic solid, for example, increasing the adhesion of the solder material to the metallization provided by the metallic solid.

Finally, the substrate may be diced to provide singulated chips (each having the chip-taiko structure). The singulated chips may be soldered on a carrier, e.g. by a die-attach process.

According to various embodiments, a porous copper layer may be provided, e.g. formed by printing and tempering, which may fill a recess of the chip-taiko structure stabilized chip. A die-attach may be provided by solder material printed over the porous copper layer.

Figure 1B:
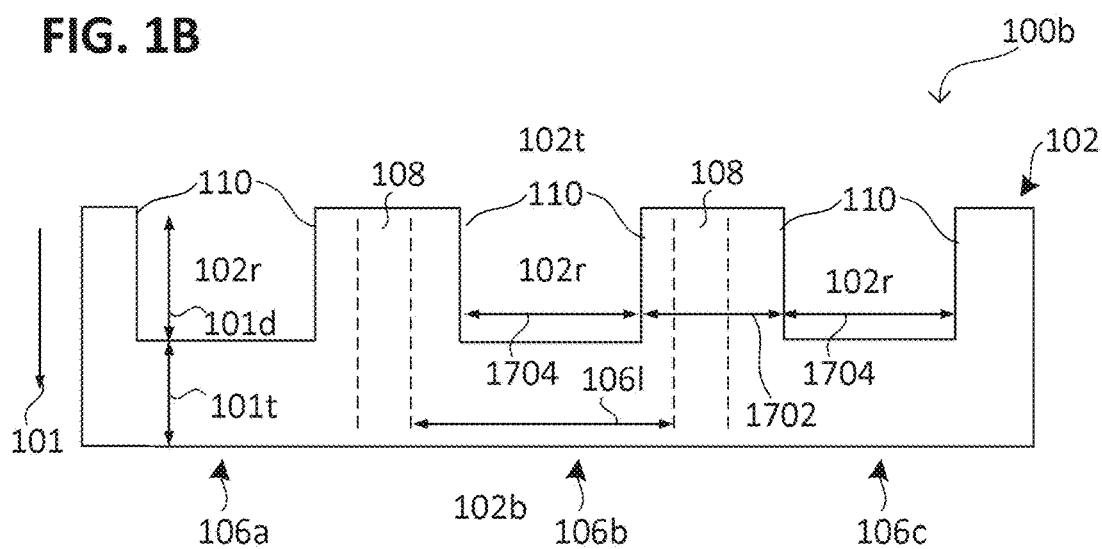
Figure 1C:
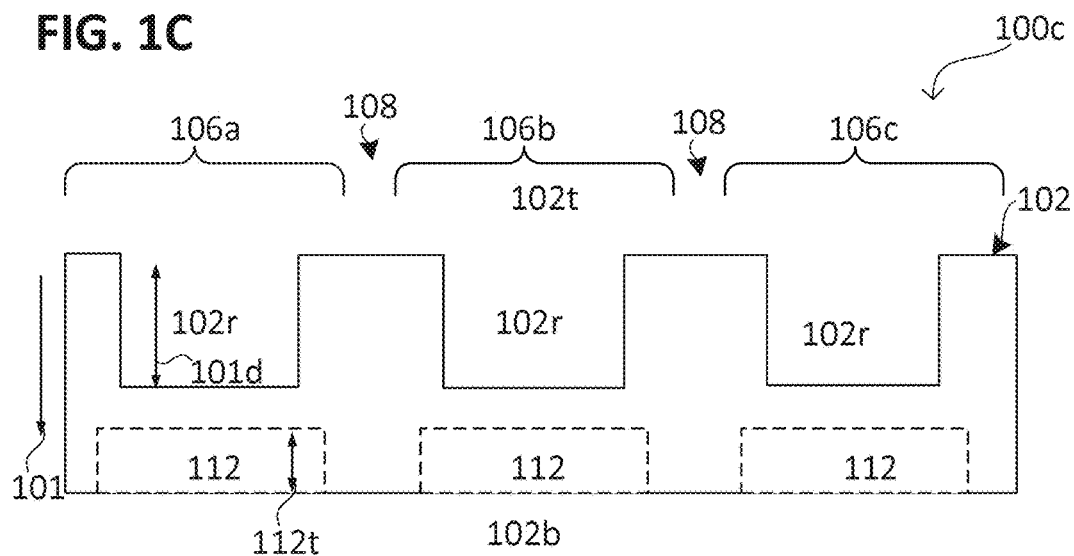

FIG. 1A to 1C respectively show an electronic device (e.g. an electronic device including a semiconductor material, also referred to as a semiconductor device) according to various embodiments, during processing in a method according to various embodiments in a schematic cross sectional view or side view.

As illustrated in view 100a, the method may include providing a substrate 102. The substrate 102 may include a first side 102t (for example, a top side) and a second side 102b (for example, a bottom side). The substrate 102 may optionally be carried by a substrate carrier 104 (e.g. a dicing foil and/or a glass carrier).

The substrate 102 may include or be formed from a plurality of device regions 106a, 106b, 106c and at least one dicing region 108. The at least one dicing region 108 may illustratively be regarded to a region of the substrate 102 in which the substrate 102 may be diced, e.g. along the at least one dicing region 108. The plurality of device regions 106a, 106b, 106c may be separated from each other by the at least one dicing region 108 of the substrate 102. In other words, between two adjacent device regions 106a, 106b of the plurality of device regions 106a, 106b, 106c a dicing region 108 of the at least one dicing region 108 may be extended. The at least one dicing region 108 may be a plurality of dicing regions 108. Each dicing region of the plurality of dicing regions 108 may be disposed between two adjacent device regions 106a, 106b of the plurality of device regions 106a, 106b, 106c. At least two dicing regions of the plurality of dicing regions 108 may at least one of be connected to each other and extend perpendicular to each other.

An extension 102c of at least one of the substrate 102 and a device region of the plurality of device regions 106a, 106b, 106c along a direction 101 pointing from the first side 102t to the second side 102b (illustratively, a thickness) may be in the range from 100 μm (micrometer) about to about 1000 μm and/or greater than or equal to about 100 μm, e.g. greater than or equal to about 200 μm, e.g. greater than or equal to about 300 μm, e.g. greater than or equal to about 400 μm.

At least one of the substrate 102, each device region of the plurality of device regions 106a, 106b, 106c and each dicing region 108 may include or be formed from a (e.g. monolithic) semiconductor material, e.g. silicon. In other words, at least one of each device region of the plurality of device regions 106a, 106b, 106c and each dicing region 108 may be a semiconductor region.

As illustrated in view 100b, the method may include forming at least one recess 102r in each device region of the plurality of device regions 106a, 106b, 106c. Each recess 102r may be formed at least one of on and from the first side 102t of the substrate 102 (extending into the respective device region of the substrate 102). Each recess 102r may at least partially be surrounded by sidewalls 110 (recess sidewalls).

An extension 101d of each recess 102r along a direction 101 pointing from the first side 102t to the second side 102b (illustratively a depth 101d of each recess 102r) may be greater than an extension 101t of the remaining (solid) material of substrate 102 along the direction 101 (illustratively a thickness 102 of the remaining portion of the device region 106a, 106b, 106c).

According to various embodiments, the extension 101t of the remaining (solid) material of substrate 102 along the direction 101 may less than about 100 μm, e.g. less than about 50 μm (e.g. less than about 40 μm, e.g. less than about 30 μm, e.g. less than about 20 μm, e.g. less than about 10 μm, e.g. less than about 5 µm) and/or in the range from 1 µm about to about 50 µm, e.g. in the range from 5 µm about to about 40 µm.

According to various embodiments, the extension 101d of the recess 102r along the direction 101 (also referred to as depth) may be greater than about 50 µm, e.g. greater than about 100 µm (e.g. greater than about 200 µm, e.g. greater than about 300 µm, e.g. greater than about 400 µm), e.g. in the range from 100 µm about to about 400 µm.

Alternatively or additionally, the extension 101d of the recess 102r along the direction 101 may be greater than about 25% of the extension 102c (also referred to as thickness 102c) of at least one of the substrate 102 and the respective device region of the substrate 102 along the direction 101, e.g. greater than about 50% (illustratively about half) of the extension 102c, e.g. greater than about 60% of the extension 102c, e.g. greater than about 70% of the extension 102c, e.g. greater than about 80% of the extension 102c, e.g. greater than about 90% of the extension 102c, e.g. greater than about 95% of the extension 102c. In other words, the recess 102r of each device region of the plurality of device regions 106a, 106b, 106c may extend through more than about 50% (e.g. more than about 60%, 70%, 80%, 90%, or 95%) of the substrate 102 (and/or the respective device region of the plurality of device regions 106a, 106b, 106c). For example, the depth 101d of the recess 102r may be about 40 µm or more and the thickness 102c of at least one of the substrate 102 and the respective device region of the substrate 102 may be about 160 µm or less.

An extension 1704 of each recess 102r perpendicular to the direction 101 (illustratively a width of each recess 102r) may be less than an extension 106l of the respective device region 106a, 106b, 106c perpendicular to the direction 101. The recess 102r may be distant to the adjacent dicing regions 108.

The recesses 110 in each device region of the plurality of device regions 106a, 106b, 106c may be formed simultaneously or after each other, e.g. by etching into the substrate 102. Forming the recesses 110 in each device region of the plurality of device regions 106a, 106b, 106c may include using an etching mask 1004 (see FIG. 10B). The etching mask 1004 may include openings 1004o exposing the regions of the substrate 102 which are designated to be etched. Etching may include or be achieved by at least one of dry etching, electrochemical etching and wet etching. By way of example, dry etching may include or be achieved by at least one of plasma etching and ion etching.

As illustrated in view 100c, the method may include forming at least one electronic component 112 in each device region of the plurality of device regions 106a, 106b, 106c. Each electronic component 112 may be formed at least one of on and from the second side 102b of the substrate 102. By way of example, each electronic component 112 may be formed by processing the second side 102b of the substrate 102, e.g. by at least one of irradiating, coating, doping and etching the second side 102b of the substrate 102. By way of example, forming each electronic component 112 may include or be achieved by doping at least one semiconductor material of the respective device region 106a, 106b, 106c. Forming an electronic component 112 may include or be achieved by forming at least one p-n-junction in the respective device region 106a, 106b, 106c.

In an alternative embodiment, the method may include forming a semiconductor component 112 other than an electronic component 112, for example at least one of an electromechanical component; an optoelectrical component; and/or an optoelectromechanical component. In general, the at least one semiconductor component 112 may be configured to transform between electrical energy and at least one of electrical energy (e.g. in case of the electrical component), mechanical energy (e.g. in case of the electromechanical component), and optical energy (e.g. in case of the optoelectrical component), e.g. both optical and mechanical energy (e.g. in case of the optoelectromechanical component). For example, the at least one semiconductor component 112 may include or be formed from a microelectromechanical element (MEMS), e.g. a microphone. Optical energy may also be referred to as radiation energy.

According to various embodiments, the at least one semiconductor component 112 (e.g. the at least one electronic component 112) may be formed (e.g. readily processed) before the recess 102r in each device region of the plurality of device regions 106a, 106b, 106c is formed. By way of example, each device region of the plurality of device regions 106a, 106b, 106c may include at least one semiconductor component 112 (e.g. at least one electronic component 112) when the substrate is provided (as described for view 100a).

An extension 101d of each recess 102r parallel to the direction 101 may be greater than about half (about 50%) an extension 112t of the at least one semiconductor component 112 (e.g. the at least one electronic component 112) parallel to the direction 101 (illustratively a thickness 112t of the at least one semiconductor component 112 (e.g. of the at least one electronic component 112)), e.g. greater than about 75% of the extension 112t, e.g. greater than about 100% of the extension 112t, e.g. greater than about 150% of the extension 112t, e.g. greater than about 150% of the extension 112t, e.g. greater than about 200% of the extension 112t. The extension 112t of the at least one semiconductor component 112 (e.g. the at least one electronic component 112) parallel to the direction 101 may be less than the extension 101t of the remaining (solid) material of substrate 102 parallel to the direction 101. The at least one semiconductor component 112 (e.g. the at least one electronic component 112) may be formed in the remaining (solid) material of substrate 102.

Figure 2A:
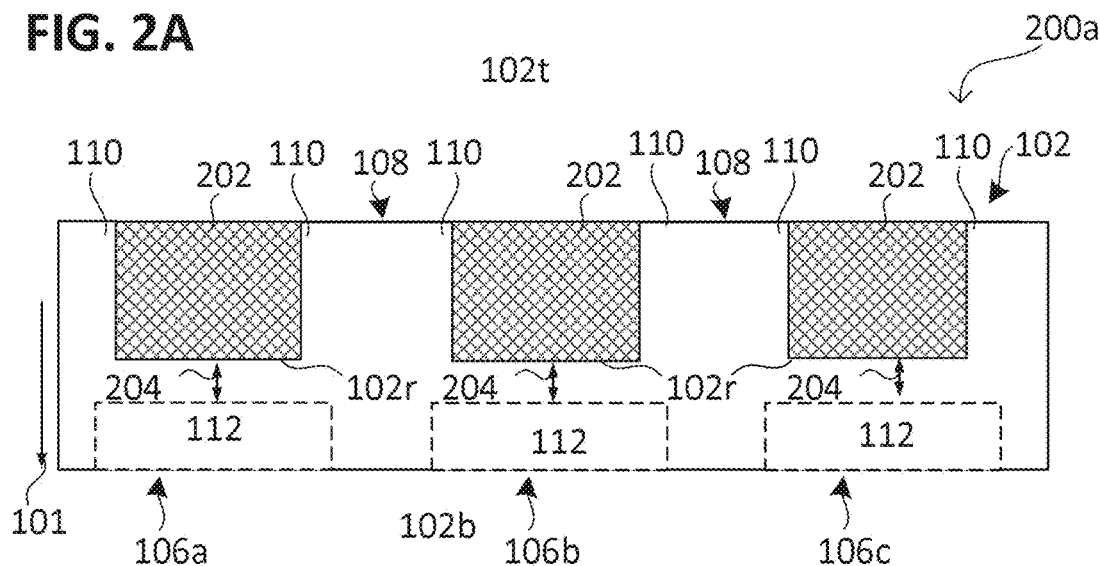
FIG. 2A to 2C respectively show an electronic device according to various embodiments during processing in a method according to various embodiments in a schematic cross sectional view or side view.
Figure 2B:
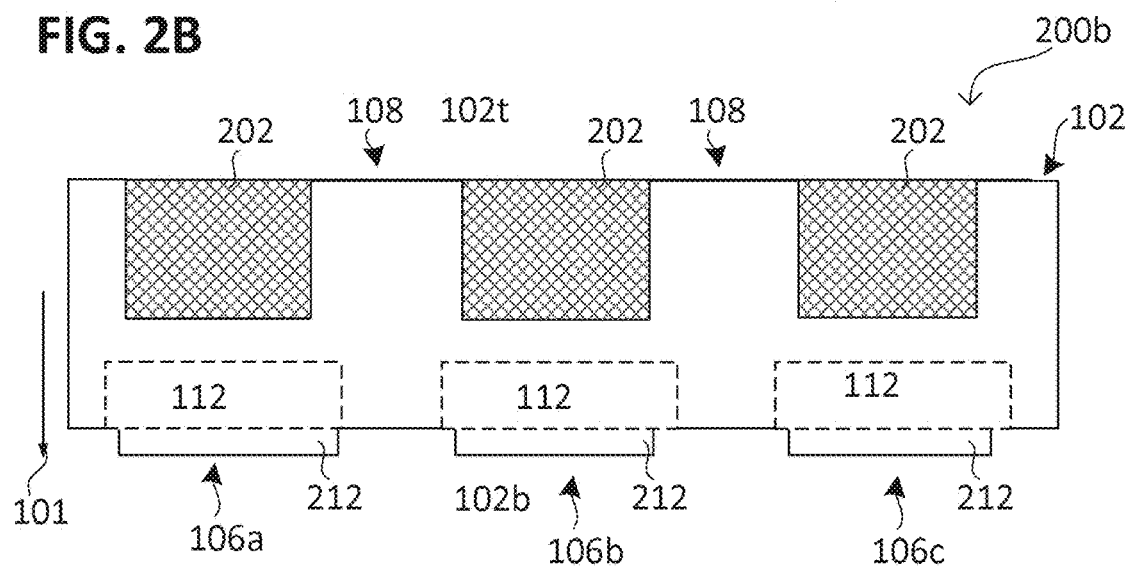
Figure 2C:
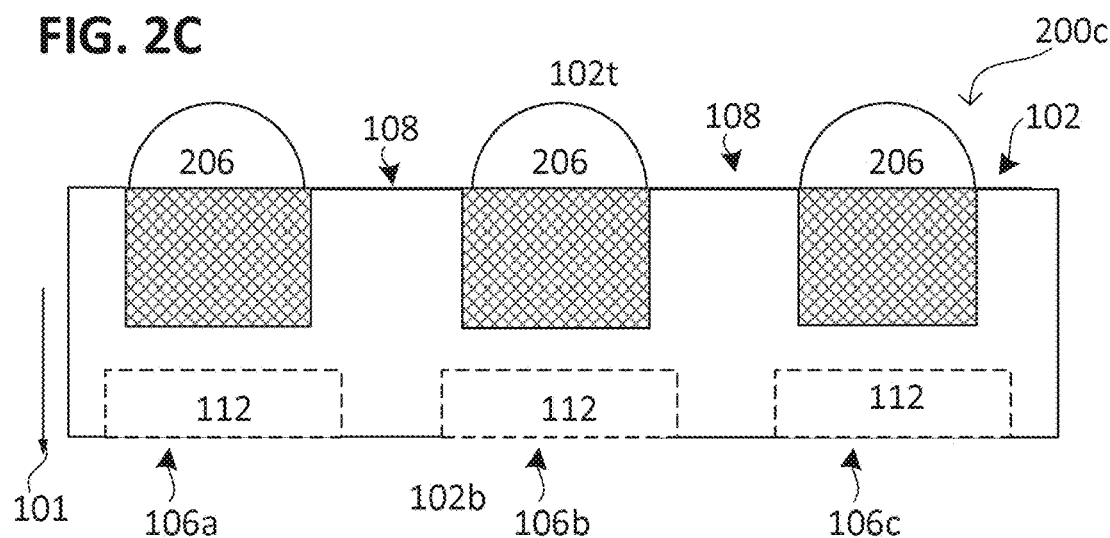

FIG. 2A to 2C respectively show an electronic device (e.g. an electronic device including a semiconductor material) according to various embodiments, during processing in a method according to various embodiments in a schematic cross sectional view or side view.

As illustrated in view 200a, the method may include forming a metallization 202 (e.g. a contact pad 202), e.g. by forming a backside metallization, in each recess 102r of the plurality of device regions 106a, 106b, 106c. The metallization 202 (e.g. the contact pad 202) and the (adjacent) at least one semiconductor component 112 (e.g. at least one electronic component 112) of each device region of the plurality of device regions 106a, 106b, 106c may be electrically connected 204 with each other. The electrical connection 204 between the at least one semiconductor component 112 (e.g. the at least one electronic component 112) and the adjacent metallization 202 (e.g. the contact pad 202) of each device region of the plurality of device regions 106a, 106b, 106c may include or be formed from an electrically conductive material, e.g. a metal. Alternatively or additionally, the at least one semiconductor component 112 (e.g. the at least one electronic component 112) and the (adjacent) metallization 202 (e.g. the contact pad 202) of each device region of the plurality of device regions 106a, 106b, 106c may physically contact each other, e.g. a doped semiconductor region of the at least one semiconductor component 112 (e.g. the at least one electronic component 112) and the respective device region.

According to various embodiments, the metallization 202 may be configured for mechanical stabilization and not necessarily electrically connected to the at least one semiconductor component 112 (e.g. the at least one electronic component 112). In this case, the metallization 202 may be also referred to as stabilizing metallization 202. The metallization 202 may be used to attach (e.g. adhere) the readily processed chip to a carrier, e.g. by soldering to the metallization 202. This may illustratively provide a reliable attachment (e.g. adhesion) of the chip to the carrier.

An electrical resistance of the metallization 202 (e.g. the contact pad 202) (e.g. its solid material, for example, without voids) may be less than about 12 μOhm·cm, e.g. less than about 10 μOhm·cm, e.g. less than about 8 μOhm·cm, e.g. less than about 6 μOhm·cm, e.g. less than about 4 μOhm·cm, e.g. less than about 2 μOhm·cm, e.g. about 1.8 μOhm·cm.

The metallization 202 (e.g. the contact pad 202) (e.g. its solid material, for example, without voids) may include a thermal conductivity of greater than about 150 Watts per meter and Kelvin (W/m·K) in other words, a high thermal conductivity, e.g. greater than about 200 W/m·K, e.g. greater than about 250 W/m·K, e.g. greater than about 300 W/m·K.

Optionally, more than one metallization 202 (e.g. more than one contact pad 202) may be formed in each recess 202 of the plurality of device regions 106a, 106b, 106c. Each recess 102r of the plurality of device regions 106a, 106b, 106c may be at least partially (in other words, partially or completely) filled by one or more metallizations 202 (e.g. one or more contact pads 202) (in other words, filled by, e.g., at least one contact pad 202).

Optionally, at least one layer may be formed between the at least one metallization 202 (e.g. the at least one contact pad 202) and the at least one semiconductor component 112 (e.g. at least one electronic component 112), e.g. at least one of: a barrier layer, a metallization layer, a redistribution layer and a passivation layer.

Forming the metallization 202 (e.g. the contact pad 202) may include or be achieved by disposing solid particles in the recess 102r, e.g. solid nano-particles. The solid particles may be dispersed in a non-solid material (e.g. a paste). The solid particles may include an anti-adhesive coating (e.g. an organic coating).

The solid particles may include or be formed from at least one of the following: solid nano-particles, in other words, particles having an extension (e.g. a diameter) less than about 100 nm; solid meso-particles, in other words, particles having an extension in the range from about 100 nm to about 1 μm; and solid macro-particles in other words, particles having an extension greater than about 1 μm.

The metallization 202 (e.g. the contact pad 202) may be formed from a paste including the solid particles and a non-solid material, e.g. a polymer binder, e.g. an organic binder. The paste may be disposed in the recess 102r by a printing deposition, e.g. at least one of stencil printing, screen-printing, and ink-jet printing. Alternatively or additionally, forming the metallization 202 (e.g. the contact pad 202) may include or be achieved by at least one of dispenser deposition, plasma dust deposition, and electrochemical deposition.

The solid particles may include or be formed from solid matter. The solid particles may include or be formed from an electrically conductive material, e.g. a metal, e.g. at least one of silver, nickel, gold and copper. By way of example, the metallization 202 (e.g. the contact pad 202) may include or be formed from at least one metal layer, e.g. a porous metal layer, e.g. a porous copper layer.

A pore characteristic of the metallization 202 (e.g. the contact pad 202) (e.g. spatially averaged) may be greater than a pore characteristic of at least one of the recess sidewalls 110, a semiconductor region of the device region of the plurality of device regions 106a, 106b, 106c, the substrate 102 and the electronic device 602. A pore characteristic may include at least one of a spatial pore-density, a spatial pore-size and a porosity, e.g. spatially averaged. In other words, the pore characteristic may include a spatial pore-density, a spatial pore-size and/or a porosity.

A porosity of the metallization 202 (e.g. the contact pad 202) (e.g. spatially averaged) of each device region of the plurality of device regions 106a, 106b, 106c may be (e.g. at least two times, e.g. at least five times, e.g. at least ten times, e.g. at least fifty times) greater than a porosity of at least one of: a recess sidewall 110 (e.g. adjacent the at least one metallization 202 (e.g. the at least one contact pad 202)), a semiconductor region of the device region of the plurality of device regions 106a, 106b, 106c and the at least one semiconductor component 112 (e.g. the at least one electronic component 112).

By way of example, a porosity of the metallization 202 (e.g. the contact pad 202) (e.g. spatially averaged) may be in the range from about 10% to about 90%, e.g. in the range from about 20% to about 80%, e.g. in the range from about 20% to about 70%, e.g. in the range from about 20% to about 60%, e.g. in the range from about 20% to about 35% or in the range from about 35% to about 60%. A porosity (e.g. spatially averaged) of at least one of the recess sidewalls 110, a semiconductor region of the device region of the plurality of device regions 106a, 106b, 106c, the at least one semiconductor component 112 (e.g. the at least one electronic component 112) and the substrate 102 may be less than about 20%, e.g. less than about 10%, e.g. less than about 5%, e.g. about 0% (substantially zero).

A porosity (also referred to as void fraction) may refer to void space in a region, and may be understood as a fraction of the volume of voids over the total volume or total area of the region. A porous layer, region or material may include a porosity in the range from 0.1 to 0.9, or in other words, as a percentage in the range from 10% to 90%. The porosity may refer to a spatially averaged value, e.g. averaged over a region, e.g. at least one of the metallization 202 (e.g. the contact pad 202), the substrate 102 and the recess sidewalls 110. According to various embodiments, the pore-density and the spatial pore-size may define the porosity. Alternatively or additionally, the pore-density and the porosity may define the spatial pore-size. Alternatively or additionally, the porosity and the spatial pore-size may define the pore-density.

The metallization 202 (e.g. the contact pad 202) may include or be formed from at least one (e.g. spatially averaged) characteristic selected from the following characteristics: a pore characteristic greater than at least one of (e.g. a semiconductor region of) the substrate 102 and the recess sidewalls 110; a hardness less than at least one of (e.g. a semiconductor region of) the substrate 102 and the recess sidewalls 110; and a specific resistivity greater than at least one of (e.g. a semiconductor region of) the substrate 102 and the recess sidewalls 110.

Forming the metallization 202 (e.g. the contact pad 202) may include heating the metallization 202 (e.g. the contact pad 202) to a temperature (e.g. to a sinter temperature or a tempering temperature) less than a melting temperature of the metallization 202 (e.g. the contact pad 202) (in other words, of a melting temperature of a solid material of the metallization 202 (e.g. the contact pad 202), e.g. of the solid particles), e.g. to a temperature in the range from about 20% to about 95% of the melting temperature of the metallization 202 (e.g. the contact pad 202), e.g. in the range from about 40% to about 90% of the melting temperature of the metallization 202 (e.g. the contact pad 202), in the range from about 60% to about 90% of the melting temperature of the metallization 202 (e.g. the contact pad 202). The tempering temperature may be less than the sinter temperature. The tempering temperature may be greater than at least one of an evaporation temperature and a decomposition temperature of a non-solid material of the metallization 202 (e.g. the contact pad 202), e.g. a fluid material (for example, a paste binder).

Alternatively or additionally, an etchant may be used to remove or decompose the non-solid material of the metallization 202 (e.g. the contact pad 202). By way of example, the etchant and heating may be used both (thermochemical process), e.g. simultaneously and/or after each other.

Heating the metallization 202 (e.g. the contact pad 202) may achieve sintering the solid particles. In other words, forming the metallization 202 (e.g. the contact pad 202) may include or be achieved by sintering. The solid particles may be provided by at least one of plasma dust or printing a paste (paste printing). After at least one of tempering and sintering, the metallization 202 (e.g. the contact pad 202) may include a plurality of at least partially interconnected pores (also referred to as porous structure).

A size (e.g. an averaged extension) of the solid particles 704p before sintering (e.g. disposed in the paste) may be in the range from about 10 nanometer (nm) to about 10 μm, e.g. in the range from about 0.1 μm to about 10 μm, e.g. in the range from about 1 μm to about 5 μm.

During forming at least one of the metallization 202 (e.g. the contact pad 202) and the recess 102r in each device region of the plurality of device regions 106a, 106b, 106c at least one of the substrate 102 and the respective device region of the plurality of device regions 106a, 106b, 106c may be adhered to a substrate carrier 104 (see FIG. 1A).

The metallization 202 (e.g. the contact pad 202) may be formed in a reductive atmosphere (chemically reductive atmosphere), e.g. heated in the reductive atmosphere (for example, to remove non-solid components of the metallization 202 (e.g. the contact pad 202)). The reductive atmosphere may include or be formed from a chemically reducing gas (e.g. at least one of formic acid or carbon monoxide) in an inert carrier gas (e.g. at least one of nitrogen or argon).

As illustrated in view 200b, the method may include forming at least one further metallization 212 (e.g. at least one further contact pad 212) (e.g. by forming a front side metallization) on the second side 102b of the substrate 102. The metallization 202 (e.g. the contact pad 202) (first metallization 202, e.g. respectively first contact pad 202) may electrically contact the first side 102t of the at least one semiconductor component 112 (e.g. at least one electronic component 112) (corresponding to the first side 102t of the substrate 102). The at least one further metallization 212 (e.g. the at least one further contact pad 212) (at least one second metallization 212, e.g. respectively at least one second contact pad 212) may contact the second side 102b of the at least one semiconductor component 112 (e.g. the at least one electronic component 112) (corresponding to the second side 102b of the substrate 102).

At least one pore characteristic (e.g. a porosity) of the at least one second metallization 212 (e.g. the at least one second contact pad 212) may be less than the pore characteristic of the first metallization 202 (e.g. the first contact pad 202). The porosity of the at least one second metallization 212 (e.g. the at least one second contact pad 212) may be less than about 20%, e.g. less than about 10%, e.g. less than about 5%, e.g. about 0% (substantially zero).

As illustrated in view 200c, the method may include disposing a solder material 206 over the first metallization 202 (e.g. the first contact pad 202). The solder material 206 may form a solder bump. The solder material may include or be formed from at least one of tin (Sn) and lead (Pb). By way of example, the solder material may be a Sn-based solder alloy or a Pb-based solder alloy. Optionally, the solder alloy may include alloying elements, such as Mg, Zn, Zr, Ni, Pd, or Au.

The solder material 206 may be disposed over the first metallization 202 (e.g. the first contact pad 202) in liquid form (e.g. in a melted phase), e.g. to form the solder bump. Alternatively or additionally, the solder material 206 may be disposed over the first metallization 202 (e.g. the first contact pad 202) in solid form, e.g. in form of solid particles dispersed in a paste (solder paste). The solder material 206 in solid form may be melted by heating to a temperature greater than a melting temperature of the solder material 206 (transformed into the melted phase), e.g. to form the solder bump.

The solder material 206 (in melted phase) may at least partially flow (seep) into the pores of the first metallization 202 (e.g. the first contact pad 202). By way of example, the solder material 206 may at least partially fill pores of the first metallization 202 (e.g. the first contact pad 202). Therefore, the first metallization 202 (e.g. the first contact pad 202) and the solder material 206 may be partially interleave each other.

Optionally, the method may include forming at least one of the following between the at least one second metallization 212 (e.g. the at least one second contact pad 212) (and/or the respective recess 102r) and the at least one semiconductor component 112 (e.g. at least one electronic component 112) of each device region of the plurality of device regions 106a, 106b, 106c: a barrier layer, a metallization layer, a redistribution layer and a passivation layer.

Figure 3A:
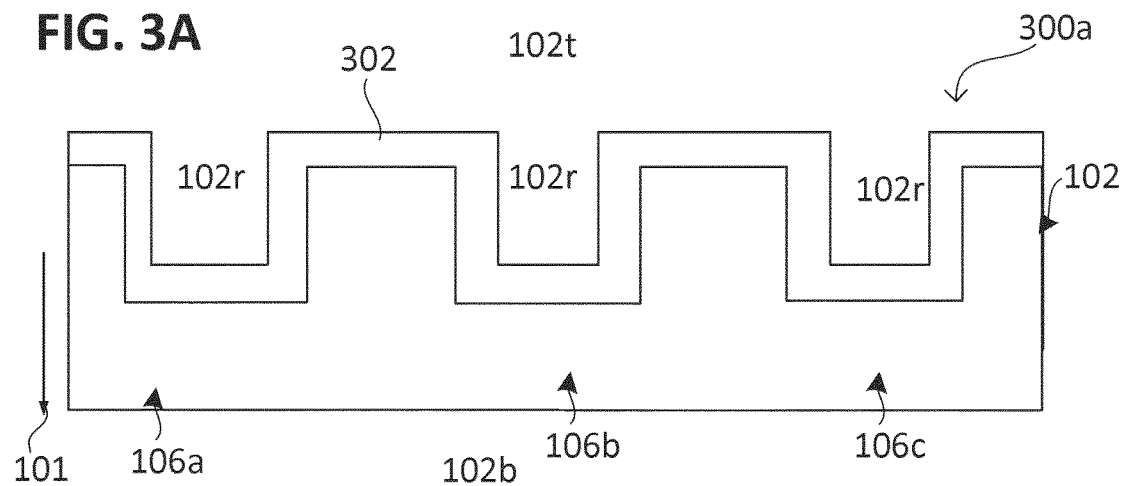
FIG. 3A to 3C respectively show an electronic device according to various embodiments during processing in a method according to various embodiments in a schematic cross sectional view or side view.
Figure 3B:
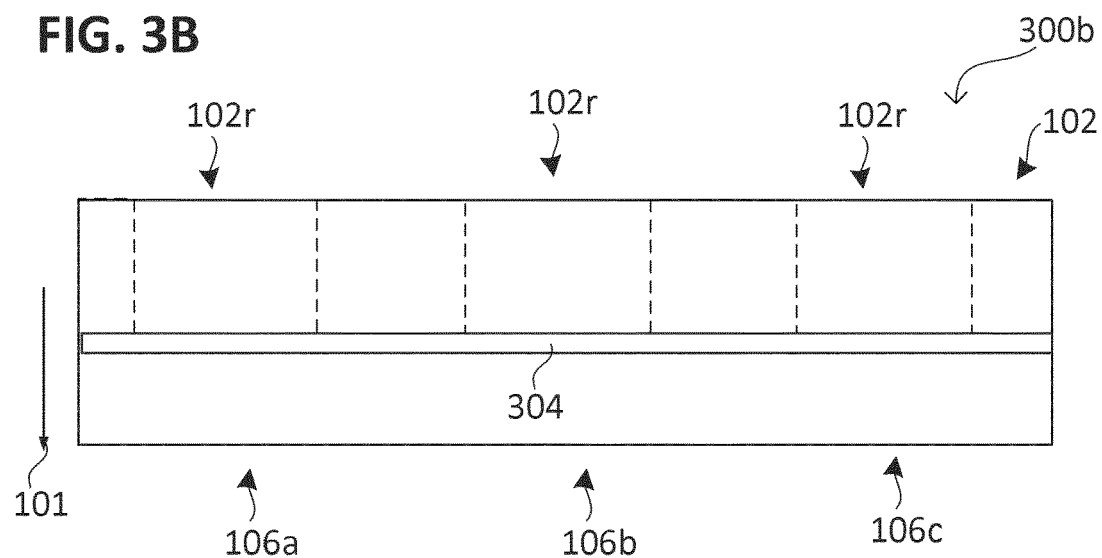
Figure 3C:
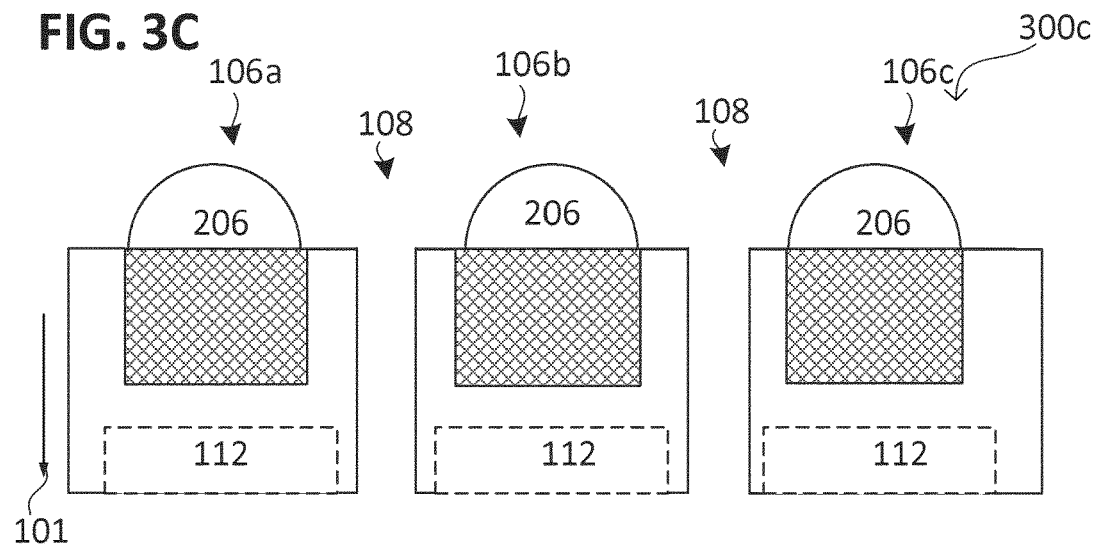

FIG. 3A to 3C respectively show an electronic device according to various embodiments, during processing in a method according to various embodiments in a schematic cross sectional view or side view.

As illustrated in view 300a, the method may include forming at least one layer 302 in the recess 102r of each device region of the plurality of device regions 106a, 106b, 106c. After forming the first metallization 202 (e.g. the first contact pad 202) and the at least one semiconductor component 112 (e.g. at least one electronic component 112) (not shown in this view), the at least one layer 302 may be formed between the at least one first metallization 202 (e.g. the first contact pad 202) and the at least one semiconductor component 112 (e.g. at least one electronic component 112). The at least one layer 302 may include or be formed from at least one of a barrier layer, a seed layer, a metallization layer and an adhesion layer. The at least one layer 302 may at least partially line the recess 102r of each device region of the plurality of device regions 106a, 106b, 106c.

By way of example, the method may include forming a barrier layer 302 at least partially lining the recess 102r of each device region of the plurality of device regions 106a, 106b, 106c. Alternatively or additionally, the method may include forming an adhesion layer 302 at least partially lining the recess 102r of each device region of the plurality of device regions 106a, 106b, 106c.

As illustrated in view 300b, the method may include forming a buried layer 304 in the substrate 102. The buried layer 304 may include or be formed from at least one of: a doped layer, an etch stop layer, an oxide layer, a barrier layer, and a nitride layer. After the buried layer 304 is formed, a recess 102r may be formed in each device region of the plurality of device regions 106a, 106b, 106c.

The buried layer 304 may provide a process alignment for stopping forming the recess 102r in each device region of the plurality of device regions 106a, 106b, 106c. The forming of the recess 102r in each device region of the plurality of device regions 106a, 106b, 106c may be configured to stop at the buried layer 304.

If the recess in each device region of the plurality of device regions 106a, 106b, 106c is etched, the buried layer 304 may include or provide an etch stop for the etching process. In that case, an etchant for etching the recess 110 in each device region of the plurality of device regions 106a, 106b, 106c may be configured to etch (a material of) the substrate 102 faster than (a material of) the buried layer 304. In other words, an etchant resistance of the buried layer 304 regarding the etchant may be greater than an etchant resistance of the substrate 102 regarding the etchant.

As shown in view 300c, the method may include singulating adjacent device regions of the plurality of device regions 106a, 106b, 106c from each other by dicing the substrate 102 in the dicing regions 108. The substrate 102 may be diced by at least one of laser irradiation, scribing and breaking, cleavage, blade dicing or mechanical sawing. The substrate 102 may be diced by removing material from the dicing regions 108. After dicing the substrate 102, each device region of the plurality of device regions 106a, 106b, 106c may provide an electronic device, which may be further processed.

If the recess 102r is formed using etching, forming the recess 102r may optionally include at least two etching processes, e.g. a first etching processes and a second etching processes. The first etching process may be configured to etch the substrate faster than the second etching process. In other words, a first etchant used during the first etching process may be configured to etch the material of the substrate 102 faster than a second etchant used during the second etching process. Alternatively or additionally, the first etching process may be configured to etch the buried layer 304 faster than the second etching process. By way of example, the second etching process may be configured to stop etching at the buried layer 304. Illustratively, the first etching process may be a fast etching process and the second etching process may be an adjustment etching process. By way of example, the second etching process may be configured to define the extension 101d of the recess 102r into the substrate 102 (see also FIG. 1B).

Figure 4A:
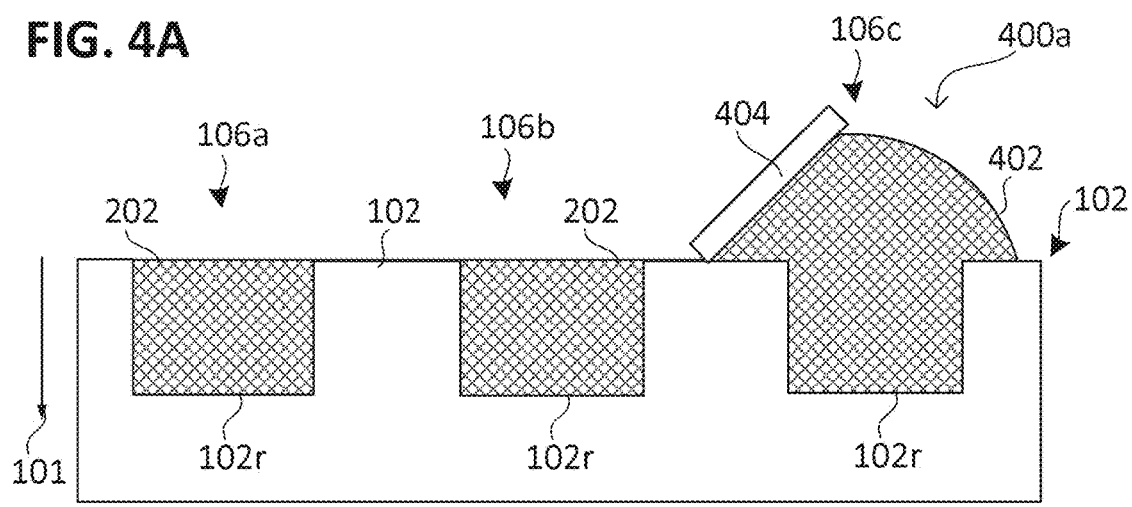
FIG. 4A to 4C respectively show an electronic device according to various embodiments during processing in a method according to various embodiments in a schematic cross sectional view or side view.
Figure 4B:
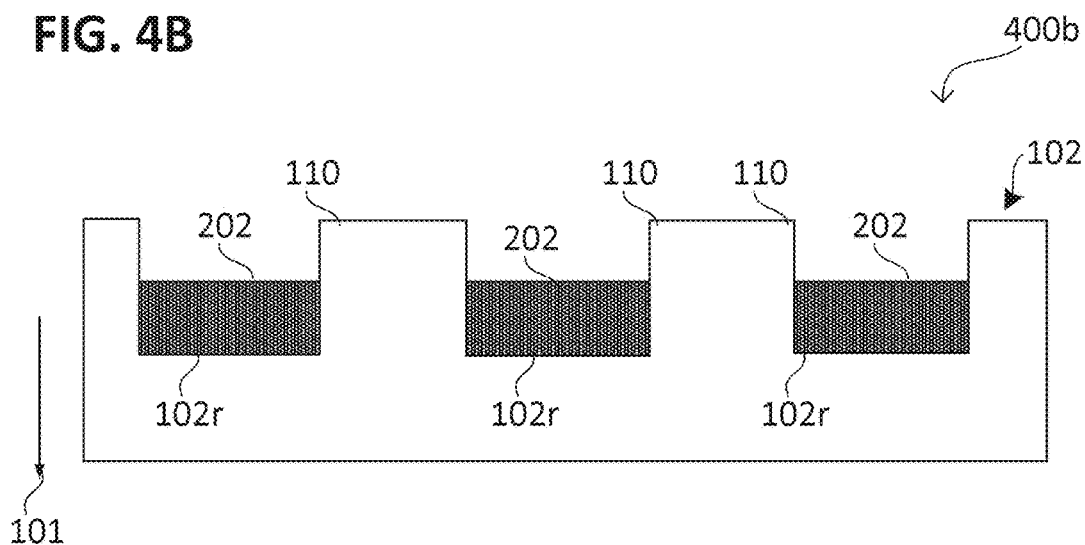
Figure 4C:
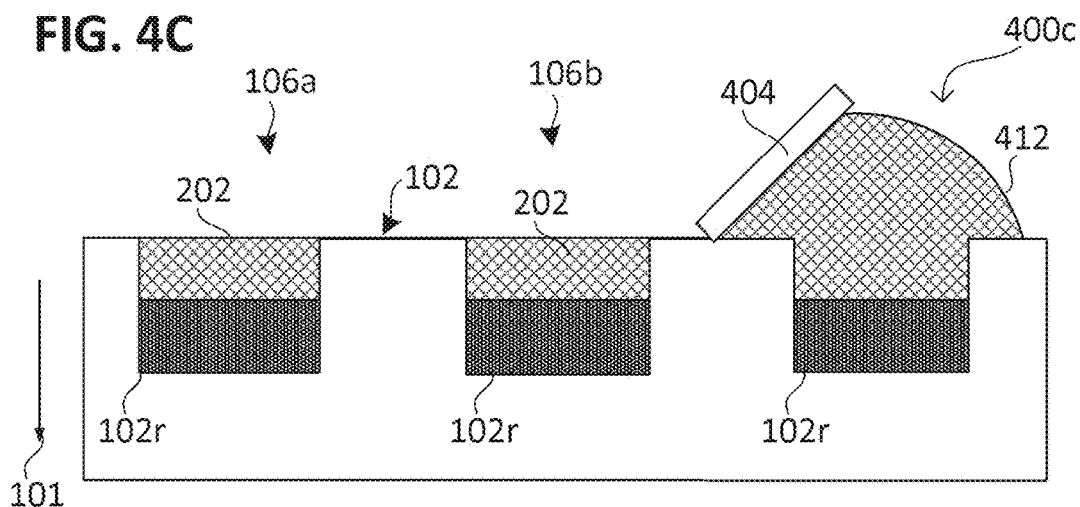

FIG. 4A to 4C respectively show an electronic device according to various embodiments, during processing in a method according to various embodiments in a schematic cross sectional view or side view.

As illustrated in view 400a, forming the metallization 202 (e.g. the first contact pad 202) may include or be achieved by disposing a paste 402 in the recess 102r of each device region of the plurality of device regions 106a, 106b, 106c (e.g. in a first deposition process). The paste 402 may include or be formed from solid particles and a polymer binder, e.g. a non-solid binder. By disposing the paste 402, the solid particles may be disposed in the recess 102r of each device region of the plurality of device regions 106a, 106b, 106c.

The paste may be screen printed by using a fill blade 404 or squeegee 404, e.g. optionally using a mask (see FIG. 5A). The paste may fill the recess 110 of each device region of the plurality of device regions 106a, 106b, 106c completely. After disposing the paste 402 in the recess 110 of each device region of the plurality of device regions 106a, 106b, 106c, the paste may be at least one of heated or chemically processed to remove the non-solid components of the paste (also referred to as drying the paste 402), e.g. by at least one of decomposing or evaporating the non-solid components of the paste 402. By way of example, the paste may be heated to a tempering temperature of more than at least one of a decomposition temperature and an evaporation temperature of the non-solid components of the paste 402 and/or of less than at least one of a melting temperature of the solid particles (in other words less than a melting temperature of a material of the solid particles) and the sintering temperature.

By way of example, the tempering temperature may be greater than about 100° C., (e.g. greater than about 150° C., e.g. greater than about 200° C., e.g. greater than about 250° C.) and/or less than about 300° C., e.g. less than about 250° C., e.g. less than about 200° C.

Alternatively or additionally, after the drying the paste 402 by tempering, the solid particles may be sintered at a sinter temperature. The sinter temperature may be in the range from about 20% of the melting temperature of the solid particles to about 70% of the melting temperature of the solid particles. By way of example, the sintering temperature may be greater than about 200° C., e.g. greater than about 250° C., e.g. greater than about 300° C., e.g. greater than about 350° C., e.g. greater than about 400° C., e.g. greater than about 500° C., and less than a melting temperature of the particles (in other words, less than a melting temperature of a material of the particles), e.g. less than about 800° C., e.g. less than about 700° C., e.g. less than about 600° C. At the sinter temperature, the solid particles may be sintered. In other words, the particles may be connected to each other without melting to the point of liquefaction. A contact area between the particles may increase during sintering.

During heating the metallization 202 (e.g. the first contact pad 202) (e.g. to at least one of the tempering temperature or the sinter temperature), the volume of the metallization 202 (e.g. the first contact pad 202) may be reduced, e.g. by at least about 20%, e.g. by at least about 40%. By removing the non-solid components from the metallization 202 (e.g. the first contact pad 202) (e.g. the paste), the volume of the metallization 202 (e.g. the first contact pad 202) may decrease (in other words, the metallization 202 (e.g. the first contact pad 202) may shrink). When the particles contact each other, the decrease in volume may stagnate until the metallization 202 (e.g. the first contact pad 202) reaches a final volume. The remaining non-solid components between the particles may be removed leaving voids (pores), e.g. filled by a gaseous material.

After heating the metallization 202 (e.g. the first contact pad 202), the metallization 202 (e.g. the first contact pad 202) may include or be formed from a pore network (see also FIG. 11A) of partially interconnected pores 304t (also referred to as porous structure 702). At least one pore (one or more pores) of the metallization 202 (e.g. the first contact pad 202) may be opened at the as-formed surface of the metallization 202 (e.g. the first contact pad 202), which may define a roughness of the metallization 202 (e.g. the first contact pad 202), e.g. in the range of the particle size.

After heating the metallization 202 (e.g. the first contact pad 202), the recess sidewalls 110 may protrude from the metallization 202 (e.g. the first contact pad 202) (e.g. due to the shrinkage). After heating the metallization 202 (e.g. the first contact pad 202), the volume of the metallization 202 (e.g. the first contact pad 202) may be less than a volume of the recess 110. In other words, after heating the metallization 202 (e.g. the first contact pad 202), the metallization 202 (e.g. the first contact pad 202) may partially fill the recess 110.

After heating the metallization 202 (e.g. the first contact pad 202), the recess may be at least partially filled further, e.g. by a paste including at least one of solid particles or solder material. The solid particles and the solder material may differ in its material. The solid particles may have a greater melting temperature than the solder material. By way of example, after a first deposition process of solid particles (e.g. as illustrated in view 400*a*), the solder material may be disposed over the metallization 202 (e.g. the first contact pad 202) of each device region of the plurality of device regions 106*a*, 106*b*, 106*c*.

Alternatively, forming the metallization 202 (e.g. the first contact pad 202) in each device region of the plurality of device regions 106*a*, 106*b*, 106*c* may include more than one deposition processes of solid particles for forming the metallization 202 (e.g. the first contact pad 202). In this case, the solder material may be disposed over the metallization 202 (e.g. the first contact pad 202) of each device region of the plurality of device regions 106*a*, 106*b*, 106*c* after the more than one deposition processes of solid particles for forming the metallization 202 (e.g. the first contact pad 202).

As illustrated in view 400*c*, forming the metallization 202 (e.g. the first contact pad 202) may include or be achieved by a further disposing of paste 412 in the recess 102*r* of each device region of the plurality of device regions 106*a*, 106*b*, 106*c* (e.g. in a second deposition process) over a prior formed portion of the metallization 202 (e.g. the first contact pad 202) (first portion). The paste 412 may include or be formed from solid particles and a polymer binder, e.g. a non-solid binder. By disposing the paste 402, the solid particles may be disposed in the recess 102*r* of each device region of the plurality of device regions 106*a*, 106*b*, 106*c*.

According to various embodiments, in a first deposition processes of the more than one deposition process (at least two deposition processes) a first portion of the metallization 202 (e.g. the first contact pad 202) is formed similar as illustrated in view 400*a*. Additionally, in a second deposition processes of the at least two deposition processes a second portion of the metallization 202 (e.g. the first contact pad 202) may be formed over the first portion of the metallization 202 (e.g. the first contact pad 202) similar as illustrated in view 400*c*.

By heating the metallization 202 (e.g. the first contact pad 202), a chemical composition of the metallization 202 (e.g. the first contact pad 202) may be changed, e.g. a first chemical composition (present before heating) may be transformed into a second chemical composition (present after heating), e.g. a metallic material. The second chemical composition may include less non-solid (e.g. a fluid material) components than the first chemical composition. The second chemical composition may include metallic properties like at least one of a high electrical conductivity, ductility and a high thermal conductivity (e.g. a greater electrical conductivity and/or thermal conductivity than the semiconductor material).

FIG. 5A to 5C respectively show an electronic device according to various embodiments, during processing in a method according to various embodiments in a schematic cross sectional view or side view.

As illustrated in view 500*a*, forming the metallization 202 (e.g. the first contact pad 202) may include using a mask 502. The mask 502 may include a plurality of openings 502*o*, wherein each opening of the plurality of openings 502*o* may be disposed over a recess 102*r* of each device region of the plurality of device regions 106*a*, 106*b*, 106*c*. The opening 502*o* may expose the recess 102*r* at least partially (partially or completely).

The solid particles may be disposed through the opening 502*o* of the mask 502, e.g. by screen printed (similar to view 400*a*). An extension 502*t* of the mask 502 may define a volume of the material disposed in and over the recess 102*r* of each device region of the plurality of device regions 106*a*, 106*b*, 106*c* (in other words, a volume of the metallization 202 (e.g. the first contact pad 202)).

As illustrated in view 500*b*, the mask 502 may be removed after disposing the solid particles in and over the recess. After removing the mask 502, the metallization 202 (e.g. the first contact pads 202) may protrude from the recess sidewalls 110. An extension 502*t* of the mask 502 may define a protrusion 502*p* of the metallization 202 (e.g. the first contact pad 202). After removing the mask 502, the metallization 202 (e.g. the first contact pads 202) may be heated (e.g. to at least one of the sinter temperature or the tempering temperature). During heating, the chemical composition of the metallization 202 (e.g. the first contact pad 202) may be changed. The volume of the metallization 202 (e.g. the first contact pad 202) before transforming the first chemical composition into the second chemical composition may be greater than a volume of the recess 102*r*.

As illustrated in view 500*c*, the mask 502 may be configured such, that a volume of the metallization 202 (e.g. the first contact pad 202) after heating (e.g. after transforming the first chemical composition into the second chemical composition) is substantially equal to a volume of the recess 102*r*. In other words, the mask 502 may be configured such, that a decrease in the volume of the metallization 202 (e.g. the first contact pad 202) during heating is compensated by the protrusion 502*p* of the metallization 202 (e.g. the first contact pad 202). Alternatively or additionally, the metallization 202 (e.g. the first contact pad 202) may be planarized to remove a remaining protrusion after heating the metallization 202 (e.g. the first contact pad 202). By way of example, a portion of the metallization 202 (e.g. the first contact pad 202), which protrudes from each device region of the plurality of device regions 106*a*, 106*b*, 106*c* may be removed.

Planarizing the metallization 202 (e.g. the first contact pad 202) may include at least one of machining, mechanical polishing, electrochemical polishing and chemical mechanical polishing. The metallization 202 (e.g. the first contact pad 202) may be planarized after at least one of sintering and tempering the solid particles. The metallization 202 (e.g. the first contact pad 202) after planarizing (in other words, the planarized metallization 202 (e.g. the first contact pad 202)) may be open-pored, in other words, the pores of the metallization 202 (e.g. the first contact pad 202) may include openings in a planarized surface of the metallization 202 (e.g. the first contact pad 202).

By planarizing the metallization 202 (e.g. the first contact pad 202), the roughness of the metallization 202 (e.g. the first contact pad 202) may be reduced. In other words, the roughness of the planarized metallization 202 (e.g. the first contact pad 202) may be less than a roughness of the as-formed metallization 202 (e.g. the first contact pad 202). By way of example, planarizing the metallization 202 (e.g. the first contact pad 202) may be configured to reduce the roughness of the metallization 202 (e.g. the first contact pad 202) to a value less than at least one of a spatial pore-size of the metallization 202 (e.g. the first contact pad 202) and a spatial particle size of the metallization 202 (e.g. the first contact pad 202) (e.g. the solid particles).

During planarizing, the roughness (e.g. mean root squared) of the metallization 202 (e.g. the first contact pad 202) may be reduced. The roughness (e.g. a root mean squared roughness) of the metallization 202 (e.g. the first contact pad 202) after planarization (in other words, the roughness of the planarized surface) may be less than about 10 µm, e.g. less than about 5 µm, e.g. less than about 2 µm, e.g. less than about 1 µm.

Figure 6A:
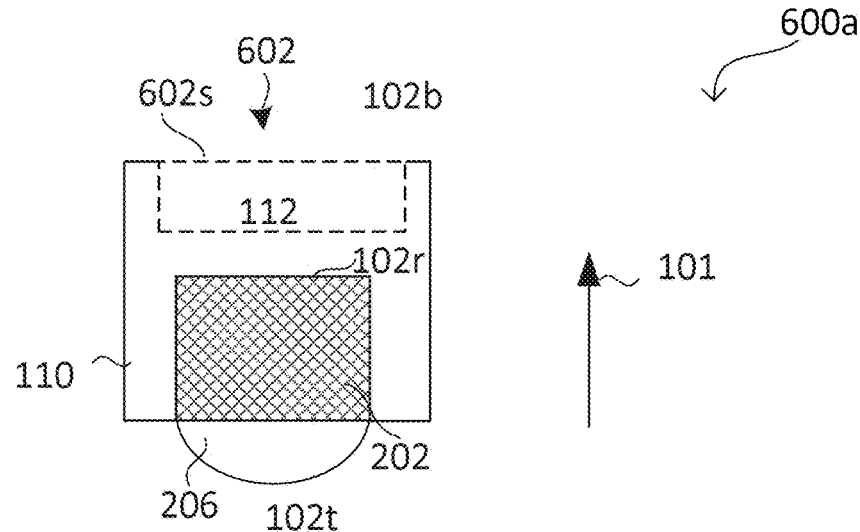
FIGS. 6A and 6B respectively show an electronic device according to various embodiments during processing in a method according to various embodiments in a schematic cross sectional view or side view.
Figure 6B:
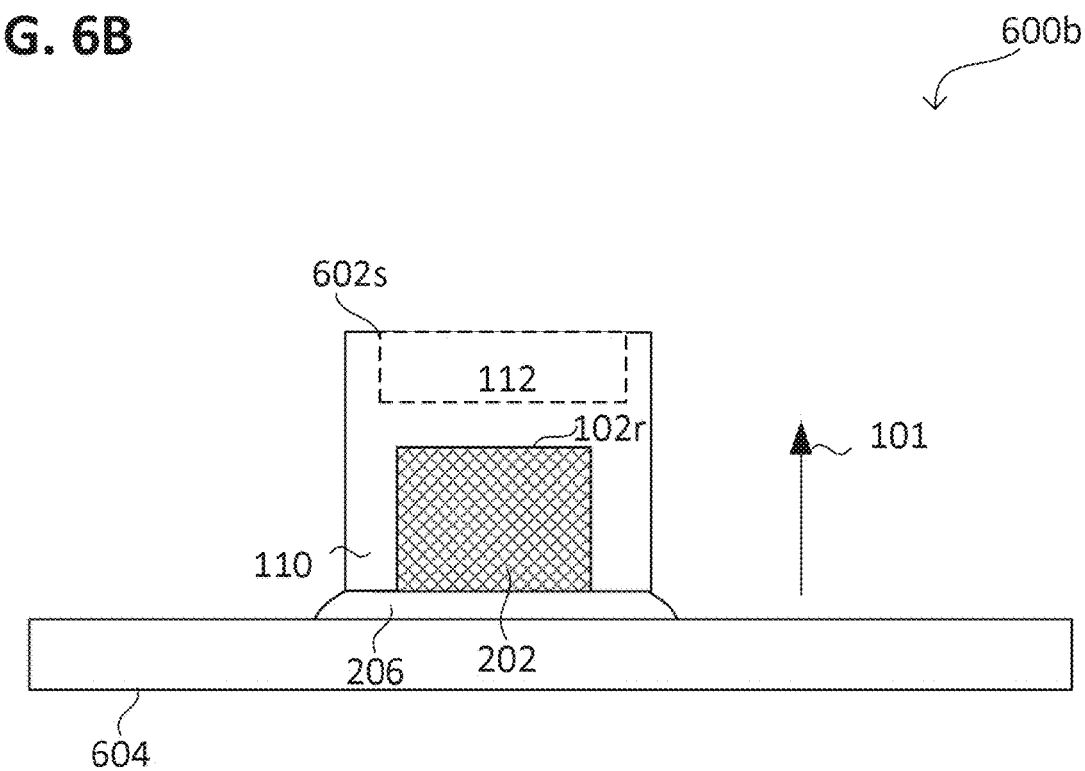

FIGS. 6A and 6B respectively show an electronic device according to various embodiments, during processing in a method according to various embodiments in a schematic cross sectional view or side view.

After singulating the plurality of device regions 106a, 106b, 106c from each other, each device region of the plurality of device regions 106a, 106b, 106c may provide an electronic device 602, as illustrated in view 600a.

The electronic device 602 may include a recess 102r extending from a first side 102t of the electronic device 602 into the electronic device 602. The recess 102r may be defined by recess sidewalls 110 of the electronic device 602. Further, the electronic device 602 may include at least one semiconductor component 112 (e.g. at least one electronic component 112) between the recess 102r and a second side 102b of the electronic device 602 opposite the first side 102t, e.g. between the recess 102r and a surface 602s of the electronic device 602 on the second side 102b. The electronic device 602 may include a metallization 202 (e.g. a first contact pad 202) formed in the recess 102r to electrically connect the at least one semiconductor component 112 (e.g. at least one electronic component 112). The metallization 202 (e.g. the first contact pad 202) may at least partially fill the recess 102r. At least one pore characteristic (e.g. a porosity) of the metallization 202 (e.g. the first contact pad 202) (e.g. spatially averaged) may be greater than a pore characteristic (e.g. a porosity) of at least one of the recess sidewalls 110, the substrate 102 and the electronic device 602.

Further, the electronic device 602 may include a solder material 206 to electrically connect the metallization 202 (e.g. the first contact pad 202), e.g. in physical contact with the metallization 202 (e.g. the first contact pad 202). The solder material 206 may protrude from the recess sidewalls 110. By way of example, the solder material 206 may be in form of a solder bump.

As illustrated in view 600b, the electronic device 602 may be electrically connected to a carrier 604, e.g. via the solder material 206. Electrically connecting the electronic device 602 to the carrier 604 may include or be achieved by a die-attach process. The carrier 604 may include or be formed from an electrically conductive receiving region over which the electronic device 602 is disposed. The solder material 206 may electrically connect the metallization 202 (e.g. the first contact pad 202) with the electrically conductive receiving region of the carrier 604. The solder material 206 may be configured to be disposed between the recess sidewalls 110 and the carrier 604. The recess sidewalls 110 may be disposed distant to the carrier 604. The recess sidewalls 110 may include or be formed from a semiconductor material, e.g. silicon.

Figure 7A:
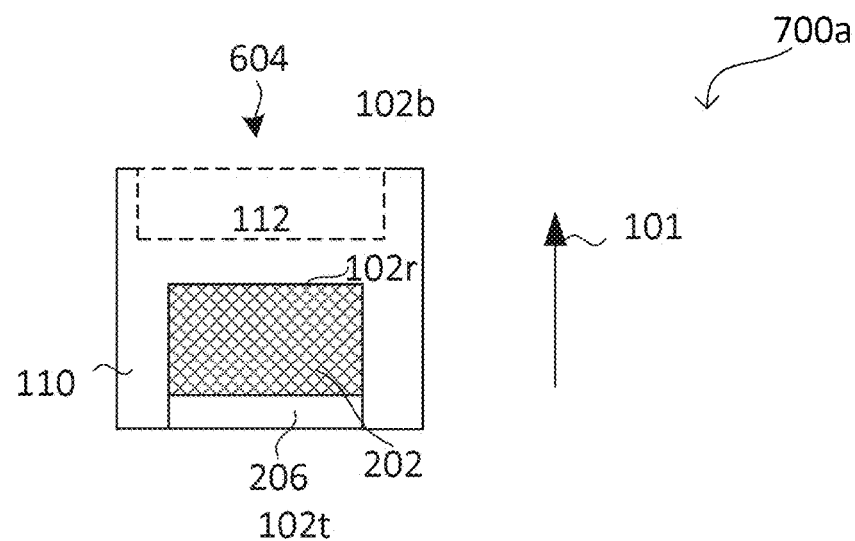
FIGS. 7A and 7B respectively show an electronic device according to various embodiments during processing in a method according to various embodiments in a schematic cross sectional view or side view.
Figure 7B:
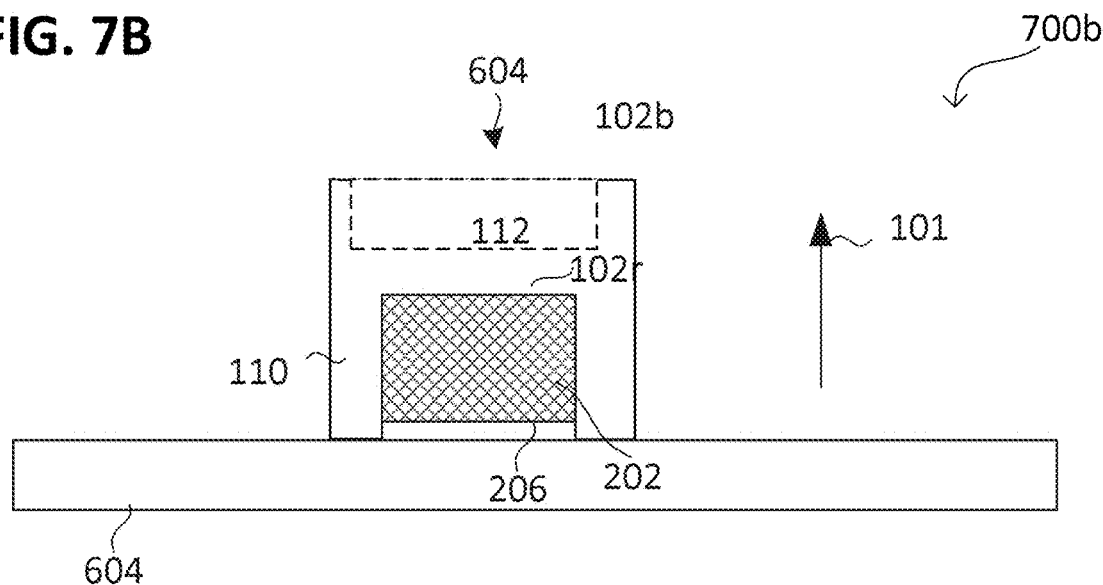

FIGS. 7A and 7B respectively show an electronic device according to various embodiments, during processing in a method according to various embodiments in a schematic cross sectional view or side view. As illustrated in view 700a, the solder material 206 may extend at least partially into the recess 102r. By way of example, the metallization 202 (e.g. the first contact pad 202) may fill a first portion of the recess 102r. The solder material 206 may fill a second portion of the recess 102r. Optionally, the solder material 206 may be aligned with the recess sidewalls 110, e.g. by planarization.

As illustrated in view 700b, the recess sidewalls 110 may be in physical contact with the carrier 604. The solder material 206 may electrically connect the carrier 604 with the metallization 202 (e.g. the first contact pad 202). The recess sidewalls 110 may at least partially surround the solder material 206.

Figure 8:
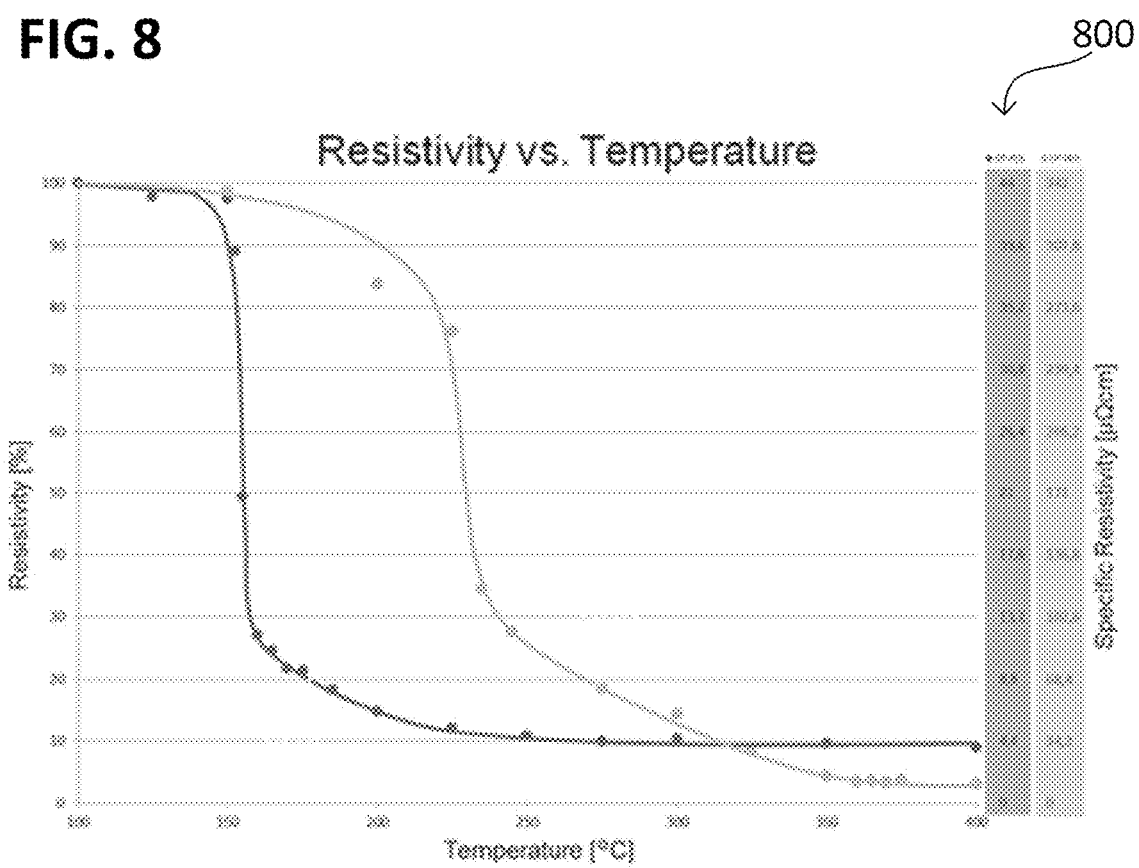
FIG. 8 shows a diagram according to various embodiments.

FIG. 8 shows a diagram 800 according to various embodiments. In the diagram 800, the resistivity 803 of the metallization 202 (e.g. the first contact pad 202) is illustrated over the temperature of the metallization 202 (e.g. the first contact pad 202), e.g. during heating. Heating may remove at least one non-solid (e.g. fluid) component from the metallization 202 (e.g. the first contact pad 202), which may result in a reduced resistivity 803 of the metallization 202 (e.g. the first contact pad 202). The illustrated resistivity 803 is normalized to a resistivity 803 at 100° C. (correlates to about 100%). During heating, the resistivity of the metallization 202 (e.g. the first contact pad 202) may drop, e.g. above the tempering temperature, e.g. to less than about 75% of the resistivity at 100° C. ($R_{100}$), e.g. to less than about 50% $R_{100}$, e.g. to less than about 25% $R_{100}$, e.g. to less than about 20% $R_{100}$. The resistivity drop may indicate a removal (e.g. by at least one of decomposition or evaporation) of the at least one non-solid component of the metallization 202 (e.g. the first contact pad 202). Alternatively or additionally, the resistivity drop may indicate a formation of an electrical connection between the solid particles of the metallization 202 (e.g. the first contact pad 202).

For a chemical composition of a first paste represented by line 802, the resistivity drops in the temperature range from about 150° to about 300° C., e.g. to less than about 30% $R_{100}$ for a temperature above 240° C., e.g. to less than about 15% $R_{100}$ for a temperature above 300° C., e.g. to less than about 5% $R_{100}$ for a temperature above 350° C. For the first paste, at least one of the decomposition temperature and the evaporation temperature of the non-solid components may be in the range from about 150° C. to about 250° C.

For a chemical composition of a second paste represented by line 804, the resistivity drops in the temperature range from about 150° to about 200° C., e.g. to less than about 30% $R_{100}$ for a temperature above 160° C., e.g. to less than about 15% $R_{100}$ for a temperature above 200° C., e.g. to less than about 10% $R_{100}$ for a temperature above 250° C. For the second paste, at least one of the decomposition temperature or evaporation temperature of the non-solid components may be in the range from about 150° C. to about 200° C.

The second paste may include more volatile non-solid components than the first paste. Alternatively or additionally, line 802 may represent a first heating process and line 804 may represent a second heating process, e.g. for the first paste and the second paste having the same chemical composition. Compared with the first heating process, the second heating process may include an additional chemical treatment than the first heating process. By way of example, the first heating process may include a (pure) heating the metallization 202 (e.g. the first contact pad 202) without applying an etchant to the metallization 202 (e.g. the first contact pad 202) and the second heating process may include a heating the metallization 202 (e.g. the first contact pad 202) with applying an etchant to the metallization 202 (e.g. the first contact pad 202) (thermochemical process).

Alternatively or additionally, the second heating process may include at least one of a more reactive etchant or a more reductive atmosphere than the first heating process.

For at least one of the first paste and the first heating process, the tempering temperature may be less than about 350° C., e.g. in the range from about 275° C. to about 350° C. For at least one of the second paste and the second heating process, the tempering temperature may be less than about 275° C., e.g. in the range from about 200° C. to about 275° C., e.g. less than about 260° C. A reduced tempering temperature may result in less thermomechanical stress in at least one of the device region and the substrate 102.

By way of example, a specific resistivity of the metallization 202 (e.g. the first contact pad 202) at or above the tempering temperature may by less than about 20 μOhm·cm (Microohm·centimeter), e.g. less than about 10 μOhm·cm less than about 5 μOhm·cm, e.g. about 4.5 μOhm·cm.

For at least one of the second paste and the second heating process, the sintering temperature may be less than for at least one of the first paste and the first heating process. At least one of the second paste and the second heating process may at least one of enable and facilitate to process the substrate 102 during being carried by a processing carrier 104, e.g. during being adhered to the processing carrier 104 (also referred to as substrate carrier 104, see FIG. 1A).

Figure 9:
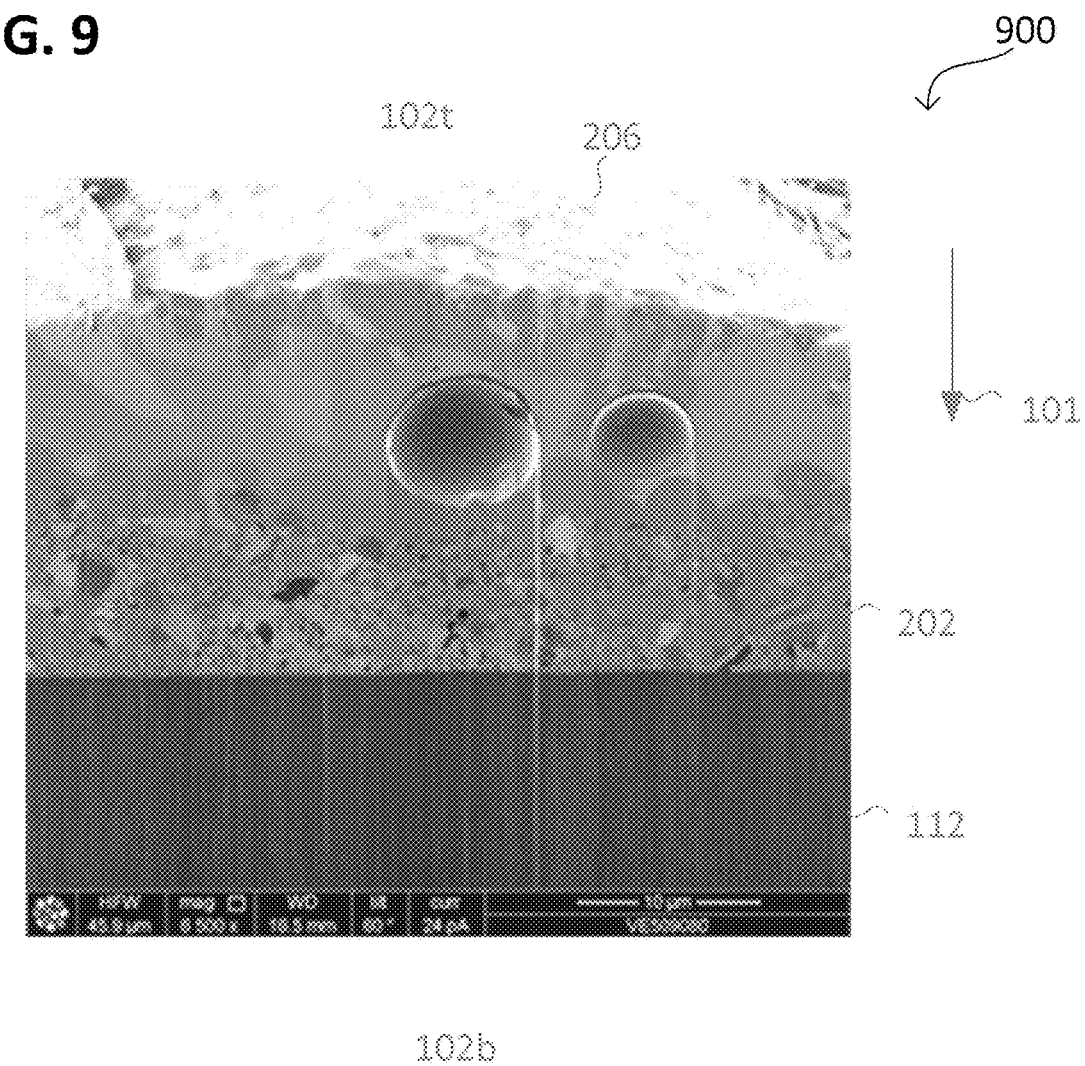
FIG. 9 shows an electronic device according to various embodiments during processing in a method according to various embodiments in a schematic cross sectional view or side view.

FIG. 9 shows an electronic device 900 according to various embodiments, during processing in a method according to various embodiments in a schematic cross sectional view or side view. The electronic device 900 may include a metallization 202 (e.g. the first contact pad 202) in electrical contact (e.g. in physical contact) with at least one semiconductor component 112 (e.g. at least one electronic component 112). Further, the electronic device 900 may include a solder material 206 in electrical contact (e.g. in physical contact) with the metallization 202 (e.g. the first contact pad 202). The solder material 206 may be disposed by printing, e.g. by at least one of screen-printing, stencil-printing, and ink-jet printing.

The solder material 206 may intrude into the metallization 202 (e.g. the first contact pad 202), e.g. during heating the solder material 206 to a reflow temperature (e.g. more than or equal to a melting temperature of the solder material 206). The solder material 206 may form a solder bump in the metallization 202 (e.g. the first contact pad 202). The solder bump may be configured for further electrical connecting the electronic device 900, e.g. by a die-attach process. Occurring air pockets 206v may be reduced at least one of in size and amount by automatically processing.

A melting temperature of the (material of the) metallization 202 (e.g. the first contact pad 202) (e.g. of the solid particles) may be greater than a melting temperature of the solder material 206, e.g. the melting temperature of the metallization 202 (e.g. the first contact pad 202) (first melting temperature) may be more than 150% of the melting temperature of the solder material 206 (second melting temperature), e.g. more than about 200% of the second melting temperature (e.g. more than about 300% of the second melting temperature, e.g. more than about 400% of the second melting temperature, e.g. more than about 500% of the second melting temperature) and/or more than about 500° C. (e.g. more than about 600° C., e.g. more than about 700° C., e.g. more than about 800° C., e.g. more than about 900° C., e.g. more than about 1000° C.). At least one of the second melting temperature and the reflow temperature may be less than about 500° C., e.g. less than about 400° C., e.g. less than about 300° C., e.g. equal to or less than about 230° C., e.g. less than about 200° C.

The solder material 206 may be heated (e.g. at minimum to the reflow temperature) in a reflow furnace, e.g. in an inert atmosphere (in other words, in an inert gas or inert gas mixture), e.g. in gaseous nitrogen.

Figure 10A:
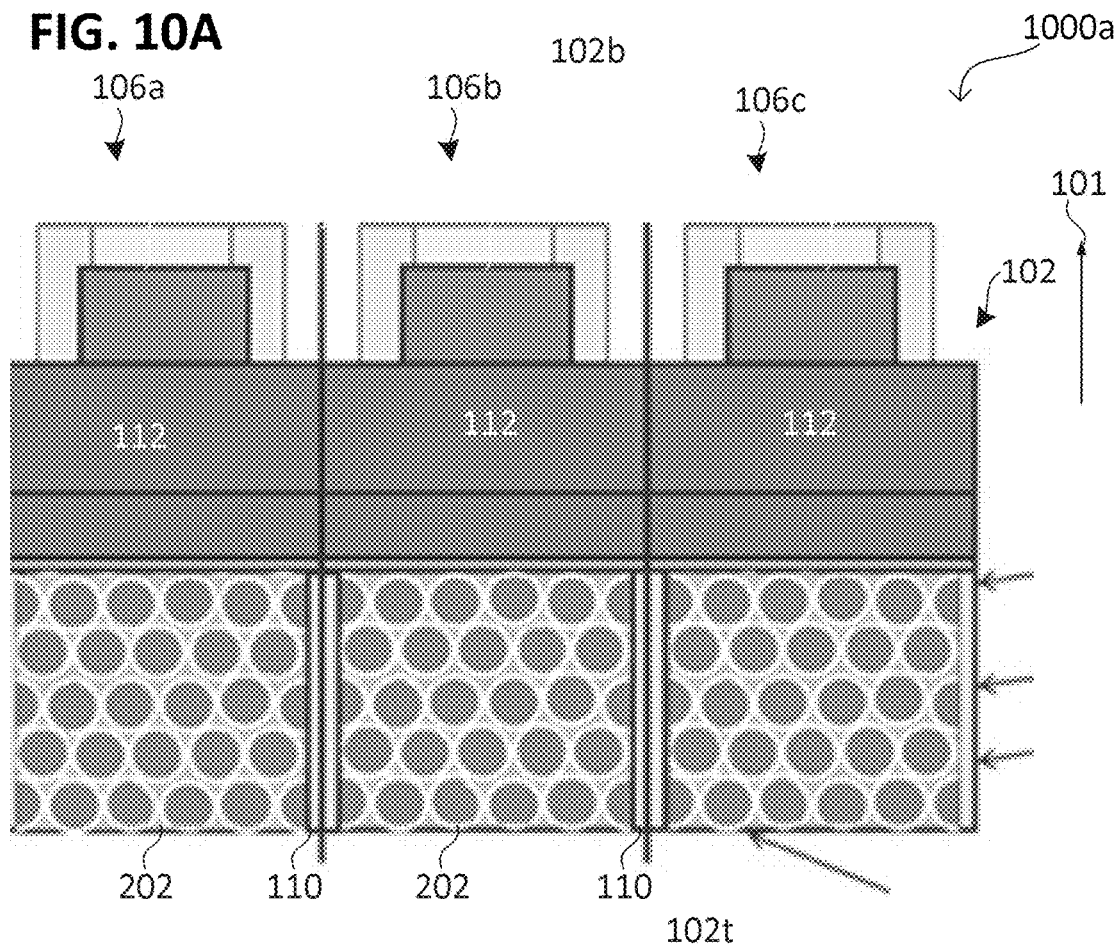
FIGS. 10A and 10B respectively show an electronic device according to various embodiments during processing in a method according to various embodiments in a schematic cross sectional view or side view.

FIG. 10A shows an electronic device according to various embodiments, during processing in a method according to various embodiments in a schematic cross sectional view 1000a or side view 1000a. Each electronic device may include or be formed from one device region of the plurality of device regions 106a, 106b, 106c. The at least one semiconductor component 112 (e.g. at least one electronic component 112) disposed in each device region of the plurality of device regions 106a, 106b, 106c may include or be formed from an integrated circuit (also referred to as chip), e.g. an ultrathin chip.

Each device region of the plurality of device regions 106a, 106b, 106c may include a stabilizing structure (also referred to as taiko-structure). The stabilizing structure (also referred to as chip-taiko structure) may include or be formed from the recess sidewalls 110. The recess sidewalls 110 may form a frame surrounding the recess 102r of each device region of the plurality of device regions 106a, 106b, 106c.

Each electronic device may include a metallization 202 (e.g. a first contact pad 202). The metallization 202 (e.g. the first contact pad 202) may provide a backside metallization. The metallization 202 (e.g. the first contact pad 202) may include or be formed from a porous metal, e.g. porous copper.

Figure 10B:
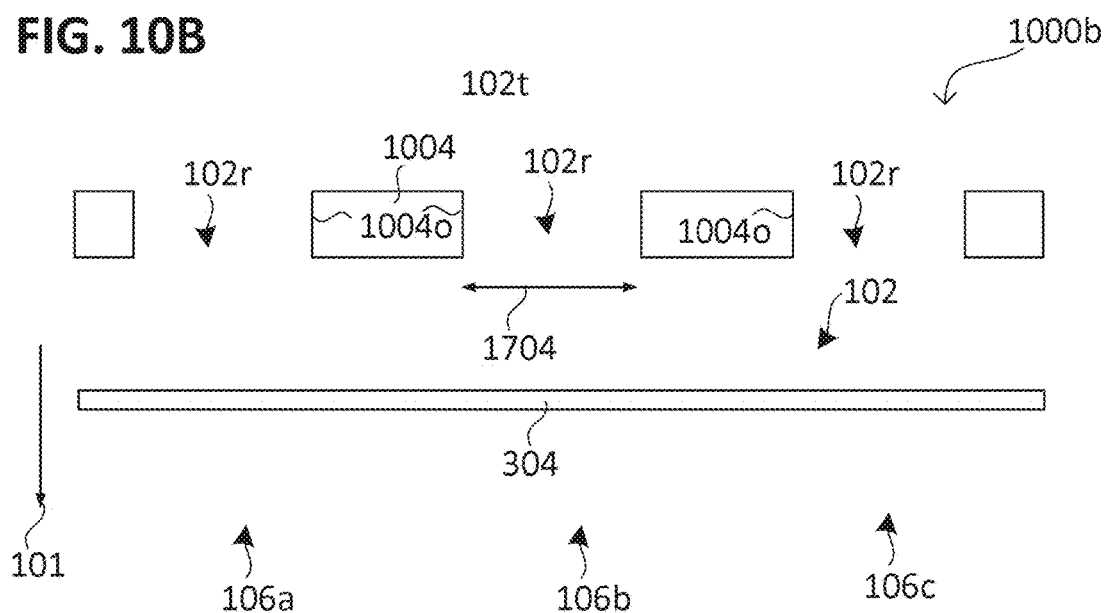

FIG. 10B shows an electronic device according to various embodiments, during processing in a method according to various embodiments in a schematic cross sectional view 1000b or side view 1000b.

The method may include forming a recess 102r in the substrate 102 in each device region of the plurality of device regions 106a, 106b, 106c. Forming the recess 102r may include using a mask 1004. The mask 1004 may include a plurality of openings 1004o, wherein each opening of the plurality of openings 1004o may be disposed over at least one device region of the plurality of device regions 106a, 106b, 106c. The opening 1004o may expose a portion of the device region of the plurality of device regions 106a, 106b, 106c, e.g. a central portion. The recess 102r of each device region of the plurality of device regions 106a, 106b, 106c may be formed through one opening of the plurality of openings 1004o, e.g. by etching through the opening, e.g. using at least one of dry etching (e.g. plasma etching), wet etching and electrochemical etching. A lateral extension (perpendicular to direction 101) of an opening of the plurality of openings 1004o may define lateral extension 1704 of the recess 102r formed through the respective opening 1004o.

Figure 11A:
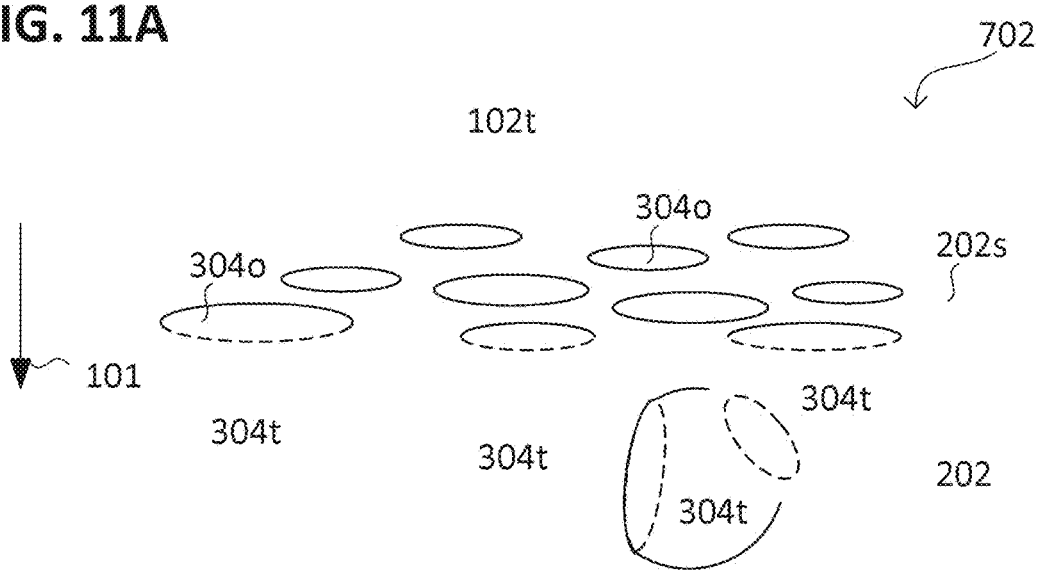
FIG. 11A to 11C respectively show an electronic device according to various embodiments during processing in a method according to various embodiments in a schematic cross sectional view or side view.

FIG. 11A shows an electronic device according to various embodiments, during processing in a method according to various embodiments in a schematic cross sectional view or side view.

The electronic device may include a metallization 202 (e.g. a first contact pad 202) including a plurality of at least partially interconnected pores 702 (porous structure 702). The porous structure 702 may be formed by a printing process, e.g. a paste printing process (e.g. by at least one of a stencil-printing process, a screen-printing process and an ink-jet printing), e.g. a metal paste printing (e.g. using a metal particle-containing paste). Alternatively or additionally, the porous structure 702 may be formed by a plasma dust deposition (e.g. using a dusty plasma). The porous structure 702 may define a pore characteristic of the solid particles, including at least one of a pore-density, a pore-size and a porosity. At least one pore characteristic of the metallization 202 (e.g. the first contact pad 202) may be greater than a pore characteristic of at least one of the recess sidewalls 110, the substrate 102, the further metallization 212 (e.g. the second contact pad 212) and the at least one semiconductor component 112 (e.g. at least one electronic component 112).

A pore-density may refer to a number of pores per area or per volume. A spatial pore-size may refer to a spatial pore volume or a spatial pore expansion (extension), e.g. at least one of perpendicular and parallel to the direction 101, e.g. a pore diameter. At least one of the spatial pore-size and the pore-density may refer to a spatially averaged value, e.g. averaged over at least one of the metallization 202 (e.g. the first contact pad 202), the recess sidewalls 110, the substrate 102, the further metallization 212 (e.g. the further contact pad 212) and the at least one semiconductor component 112 (e.g. at least one electronic component 112). At least one pore of the porous structure 702 (e.g. a plurality of pores) may be opened 304o, e.g. at the surface 202. The surface 202s may be (macroscopically) perpendicular to direction 101 (in other words, the surface 202s may define a macroscopic surface plane perpendicular to direction 101).

According to various embodiments the pore network 702 may include or be formed from at least one of the following: micropores, in other words, pores 304t with the extension (e.g. at least one of perpendicular or parallel to the surface 202s, e.g. a diameter) less than about 100 nm; mesopores, in other words, pores 304t with an extension (e.g. at least one of perpendicular or parallel to the surface 202s, e.g. a diameter) in the range from about 100 nm to about 1 μm; and macropores in other words, pores 304t with an extension (e.g. at least one of perpendicular and parallel to the surface 202s, e.g. a diameter) greater than about 1 μm.

Figure 11B:
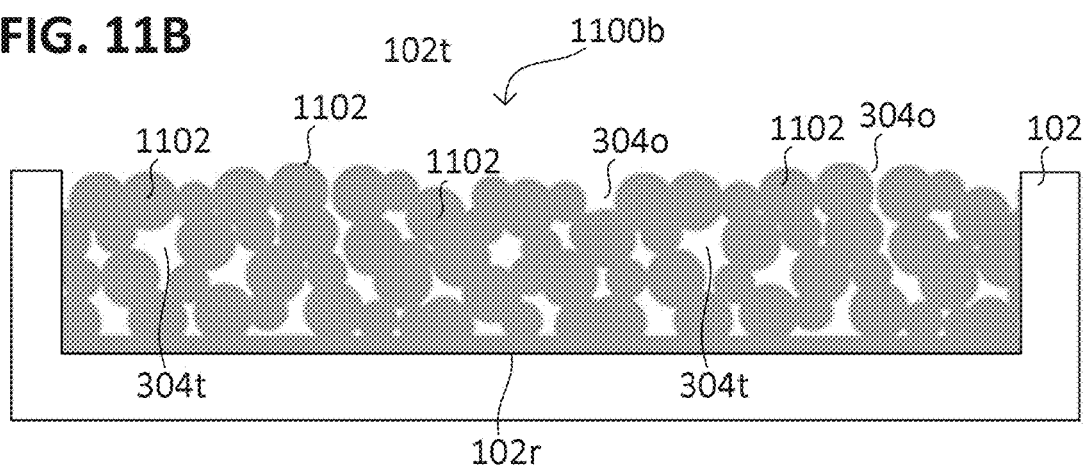
Figure 11C:
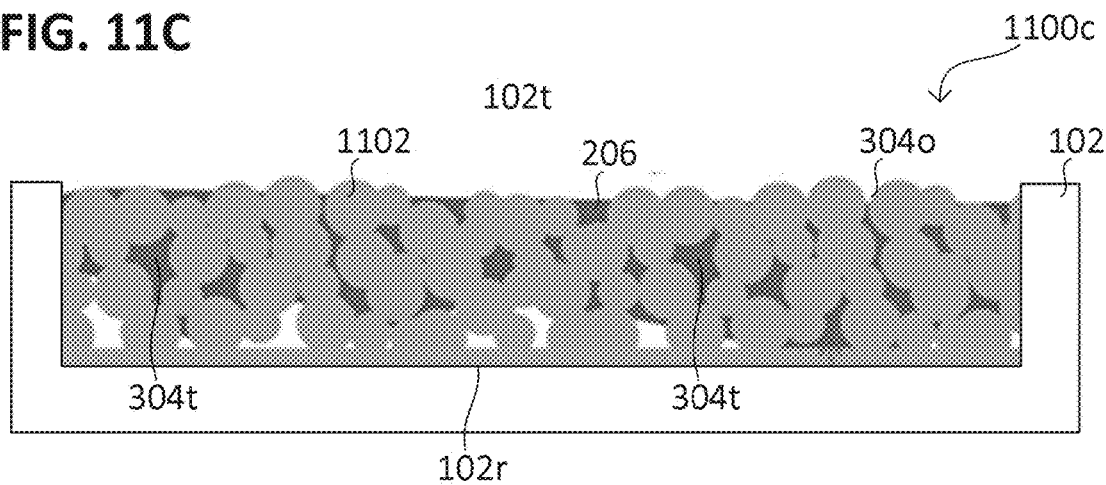

FIGS. 11B and 11C respectively show an electronic device according to various embodiments, during processing in a method according to various embodiments in a schematic cross sectional view or side view.

As illustrated in view 1100b, the metallization 202 (e.g. the first contact pad 202) may include or be formed from a plurality of solid particles 1102.

According to various embodiments, a pore size (e.g. an spatial averaged pore size) of the porous structure 702 may be in the range from about 0.1 μm to about 10 μm, e.g. in the range from about 0.5 μm to about 10 μm, e.g. in the range from about 1 μm to about 5 μm. The pore size may define at least one of an extension of the pores 304t of the porous structure 702 parallel to the surface 202s (parallel extension) and an extension of the pores 304t of the porous structure 702 into the metallization 202 (e.g. the first contact pad 202), e.g. perpendicular to the surface 202s (vertical extension).

The metallization 202 (e.g. the first contact pad 202) may be formed from solid particles (also referred to as granular material). The solid particles may be sintered together, e.g. such that their grains contact each other in a contact area. During sintering, the solid particles may be compacted and connected together forming a solid mass of a skeletal structure of the porous structure 702 (also referred to as pore matrix).

The metallization 202 (e.g. the first contact pad 202) may include or be formed from porous copper, e.g. printed from a paste in the recess 102r, e.g. by at least one of stencil printing, screen-printing and ink-jet printing. The paste may include or be formed from copper particles and a non-solid binder. The as printed metallization 202 (e.g. the as printed first contact pad 202) may be dried at a tempering temperature (e.g. for 1 hour at more than or equal to about 60° C.) to at least partially remove the non-solid components of the paste and sintered at a sintering temperature, e.g. above at least 400° C. Drying may provide to remove a non-solid (e.g. liquid) component of the paste before sintering. The tempering temperature may be less than 30% of the melting temperature of the metallization 202 (e.g. the first contact pad 202) (e.g. the solid particles), e.g. more than the evaporation temperature of the non-solid (e.g. liquid) component (e.g. an organic solvent).

Heating the metallization 202 (e.g. the first contact pad 202) may include a heating-up time and a holding time at tempering temperature. During holding at tempering temperature, at least one non-solid (e.g. liquid) component of the metallization 202 (e.g. the first contact pad 202) (e.g. the paste) may be removed. The metallization 202 (e.g. the first contact pad 202) may be heated in a chemically reducing atmosphere, e.g. including a chemically reducing gas (e.g. at least one of formic acid or carbon monoxide) in an inert carrier gas (e.g. at least one of nitrogen or argon). Alternatively, the metallization 202 (e.g. the first contact pad 202) may be formed using another solid particle deposition process, e.g. plasma dust deposition. A porosity of the metallization 202 (e.g. the first contact pad 202) may be in the range from about 40% to about 50%.

As illustrated in view 1100c, a solder material 206 may be disposed at least one of in and on the metallization 202 (e.g. the first contact pad 202). The metallization 202 (e.g. the first contact pad 202) may include or be formed from a plurality of solid particles 1102. The solder material 206 may extend into at least one opening 304o of the metallization 202 (e.g. the first contact pad 202). Alternatively or additionally, the solder material 206 may extend into at least one pore of the porous structure 702.

Figure 12A:
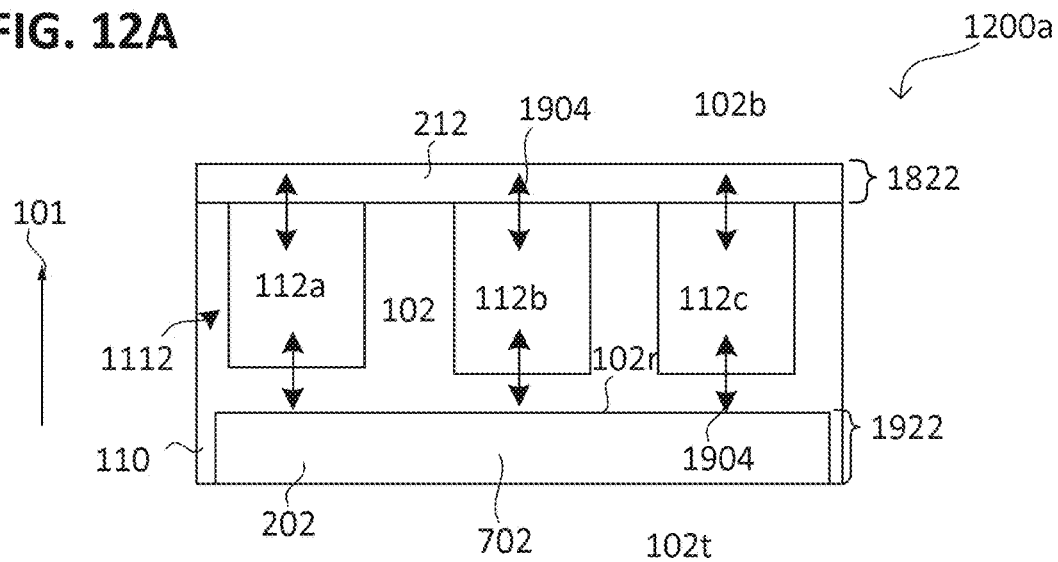
FIGS. 12A and 12B respectively show an electronic device according to various embodiments during processing in a method according to various embodiments in a schematic cross sectional view or side view.

FIG. 12A shows an electronic device 1200a (e.g. a semiconductor device 1200a) according to various embodiments, during processing in a method according to various embodiments in a schematic cross sectional view or side view.

According to various embodiments, the electronic device 1200a may include a plurality of semiconductor components 112 (e.g. a plurality of electronic components) (also referred to as semiconductor circuit elements) 112a, 112b, 112c electrically connected 1904 in parallel to each other and in electrical contact with one or more metallizations 202, 212 (e.g. one or more contact pads 202, 212).

The electronic device 1200a may include a first metallization 1922 on a first side 102t of the substrate 102. Each semiconductor component (e.g. each electronic component) of the plurality of semiconductor components 112a, 112b, 112c (e.g. of the plurality of electronic components 112a, 112b, 112c) may be electrically connected 1904 to the first metallization 1922. The first metallization 1922 may include a porous structure 702. The first metallization 1922 may include or be formed from the first metallization 202 (e.g. the first contact pad 202).

Alternatively or additionally, the electronic device 1200a may include a second metallization 1822 on a second side 102b of the substrate 102. Each semiconductor component (e.g. each electronic component) of the plurality of semiconductor components 112a, 112b, 112c (e.g. of the plurality of electronic components 112a, 112b, 112c) may be electrically connected 1904 to the second metallization 1822. The second metallization 1822 may include or be formed from at least one a second metallization 212 (e.g. the second contact pad 212). Alternatively or additionally, the second metallization 1822 may include or be formed from a redistribution layer.

Each semiconductor component of the plurality of semiconductor components 112a, 112b, 112c (e.g. each electronic component of the plurality of electronic components 112a, 112b, 112c) may include or be formed from at least one of a diode structure (also referred to as diode cell) or a transistor structure (also referred to as transistor cell). The plurality of semiconductor components 112a, 112b, 112c (e.g. the plurality of electronic components 112a, 112b, 112c) may be part of or form a power electronic circuit structure 1112. By way of example, each semiconductor component of the plurality of semiconductor components 112a, 112b, 112c (e.g. each electronic component of the plurality of electronic components 112a, 112b, 112c) (e.g. the power electronic circuit structure 1112) may include or be formed from a transistor (e.g. a power transistor). Alternatively or additionally, each semiconductor component of the plurality of semiconductor components 112a, 112b, 112c (e.g. each electronic component of the plurality of electronic components 112a, 112b, 112c) (e.g. the power electronic circuit structure 1112) may include or be formed from a vertical structure. A vertical structure may be understood as providing a current flow from the first side 102t to the second side 102b or vice versa, e.g. parallel to direction 101. Alternatively or additionally, each semiconductor component of the plurality of semiconductor components 112a, 112b, 112c (e.g. each electronic component of the plurality of electronic components 112a, 112b, 112c) (e.g. the power electronic circuit structure 1112) may include at least one gate terminal. The at least one gate terminal may be electrically connected to the second metallization 1822 (if present).

According to various embodiments, at least one of the first metallization 202 (e.g. at least one first contact pad 202) and the at least one second metallization 212 (e.g. at least one second contact pad 212) may be at least one of the following solderable and bondable.

Figure 12B:
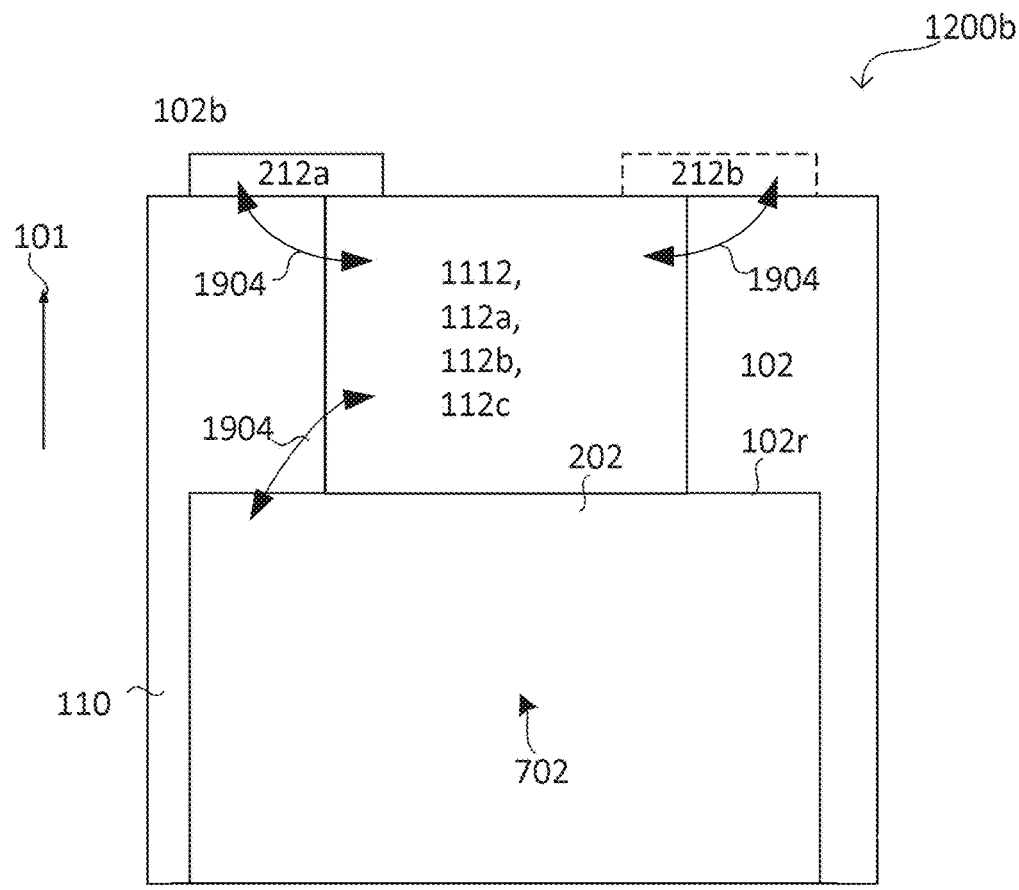

FIG. 12B shows an electronic device 1200b (e.g. a semiconductor device 1200b) according to various embodiments, during processing in a method according to various embodiments in a schematic cross sectional view or side view.

The electronic device 1200b may include at least one semiconductor component 112a, 112b, 112c (e.g. at least one electronic component 112a, 112b, 112c), e.g. forming the power electronic circuit structure 1112, formed at least one of over and in a semiconductor region of the substrate 102. By way of example, the at least one semiconductor component 112a, 112b, 112c, 112 (e.g. the at least one electronic component 112a, 112b, 112c, 112) may include or be formed from at least one transistor (in other words, one or more transistors) in electrical contact 1904 to at least one metallization 202, 212a, 212b (e.g. at least one contact pad 202, 212a, 212b). The at least one semiconductor component 112a, 112b, 112c, 112 (e.g. the at least one electronic component 112a, 112b, 112c, 112) may include or be formed from insulated-gate bipolar transistor.

According to various embodiments, the electronic device 1200b may include a first metallization 202 (e.g. first contact pad 202) (e.g., at least one collector contact pad 202). The first metallization 202 (e.g. first contact pad 202) may be electrically connected 1904 to the at least one semiconductor component 112a, 112b, 112c, 112 (e.g. the at least one electronic component 112a, 112b, 112c, 112).

Alternatively or additionally, the electronic device 1200b may include at least one second metallization 212a, 212b (e.g. at least one second contact pad 212a, 212b) (e.g. a source/drain contact pad 212a) formed in electrical contact 1904 to the at least one semiconductor component 112a, 112b, 112c, 112 (e.g. the at least one electronic component 112a, 112b, 112c, 112). The at least one second metallization 212a, 212b (e.g. at least one second contact pad 212a, 212b) may optionally include a gate contact pad 212b, e.g. which may be formed electrically insulated from at least one of the substrate 102 and the at least one semiconductor component 112a, 112b, 112c, 112 (e.g. the at least one electronic component 112a, 112b, 112c, 112). Optionally, the at least one second metallization 212a, 212b (e.g. the at least one second contact pad 212a, 212b) may be formed by structuring the second metallization layer 1822.

A method of forming a device 1200a, 1200b may include: forming an active chip area including at least one semiconductor component 112a, 112b, 112c, 112 (e.g. the at least one electronic component 112a, 112b, 112c, 112) in a substrate 102; forming at least two metallization 202, 212a, 212b (e.g. at least two contact pads 202, 212a, 212b) in electrical contact with the active chip area. The at least two metallization 202, 212a, 212b (e.g. the at least two contact pads 202, 212a, 212b) may include a first metallization 202 (e.g. the first contact pad 202) formed in a recess 102r in the substrate 102 and at least one second metallization 212a, 212b (e.g. the at least one second contact pad 212a, 212b). The first metallization 202 (e.g. the first contact pad 202) may include a pore characteristic less than at least one of the at least one second metallization 212a, 212b (e.g. the at least one second contact pad 212a, 212b), the substrate 102, the recess sidewalls 110, and the at least one semiconductor component 112 (e.g. the at least one electronic component 112). Alternatively or additionally, the first metallization 202 (e.g. the first contact pad 202) may include a hardness greater than at least one of the substrate 102, the at least one second metallization 212a, 212b (e.g. the at least one second contact pad 212a, 212b), the recess sidewalls 110, and the at least one semiconductor component 112a, 112b, 112c (e.g. the at least one electronic component 112a, 112b, 112c). Alternatively or additionally, the first metallization 202 (e.g. the first contact pad 202) may include a density greater than at least one of the substrate 102, the at least one second metallization 212a, 212b (e.g. the at least one second contact pad 212a, 212b), the recess sidewalls 110, and the at least one semiconductor component 112a, 112b, 112c (e.g. the at least one electronic component 112a, 112b, 112c). The first metallization 202 (e.g. the first contact pad 202) may include or be formed from a porous stress-compensation material to provide a mechanical rigidity less than at least one of the at least one second metallization 212a, 212b (e.g. the at least one second contact pad 212a, 212b), the substrate 102, the recess sidewalls 110, and the at least one semiconductor component 112a, 112b, 112c (e.g. the at least one electronic component 112a, 112b, 112c).

Figure 13A:
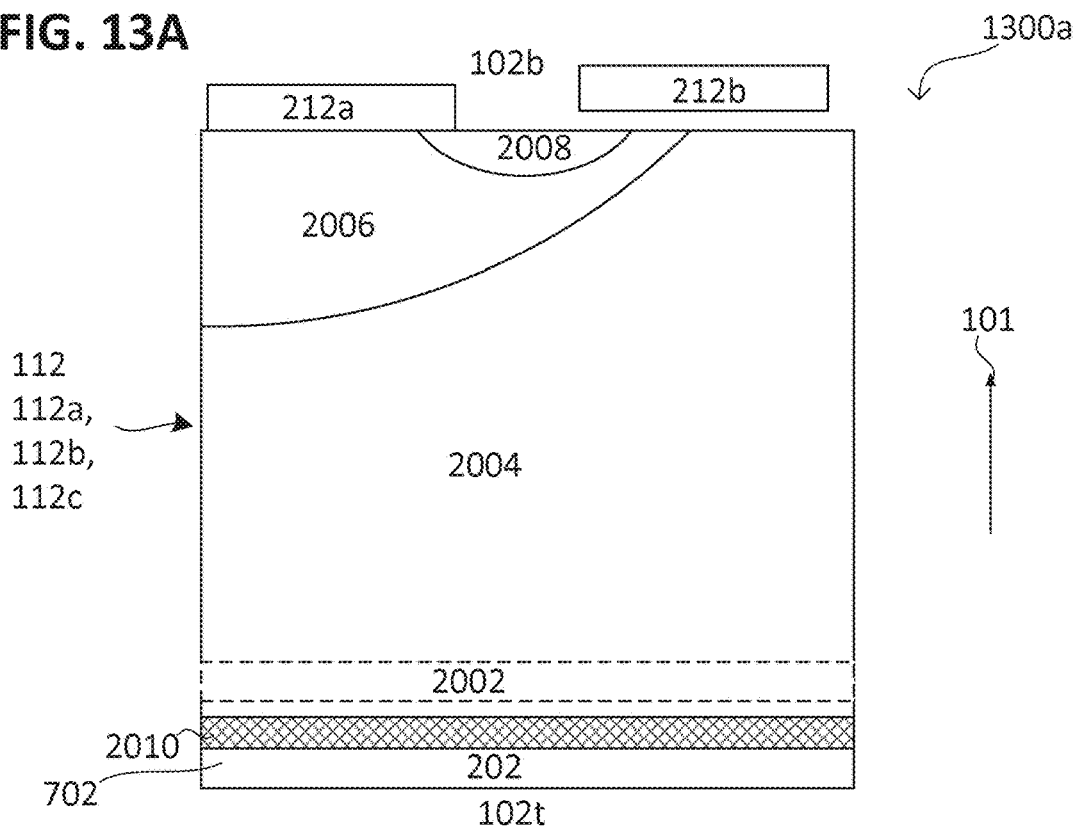
FIGS. 13A and 13B respectively show an electronic device according to various embodiments during processing in a method according to various embodiments in a schematic cross sectional view or side view.

FIG. 13A shows an electronic device 1300a according to various embodiments, during processing in a method according to various embodiments in a schematic cross sectional view or side view, the electronic device 1300a including at least one at least one electronic component 112a, 112b, 112c, e.g. a power electronic circuit structure (power chip).

The electronic device 1300a may include a dopant layer 2010 formed on the first side 102t. The dopant layer 2010 may include or be formed from a first doping type. The dopant layer 2010 may include or be formed from a collector region (a doped region in form of a collector region).

The electronic device 1300a may further include a first contact pad 202 in form of a collector contact pad 202 (e.g., a drain contact pad 202). The first contact pad 202 may electrical contact the dopant layer 2010. The first contact pad 202 may include or be formed from a metallization layer.

Further, the electronic device 1300a may include a first doped region 2006. The first doped region 2006 may include or be formed from a base region. The first doped region 2006 may include (e.g. a dopant having) a doping type equal to the dopant layer 2010 (in other words, the dopant of the dopant layer 2010), e.g. the first doping type. The electronic device 1300a may further include a second contact pad 212a electrical contacting the first doped region 2006. The second contact pad 212a may include or be formed from an emitter contact pad 212a (e.g. a source contact pad 212a). The second contact pad 212a may include or be formed from a metallization layer.

Further, the electronic device 1300a may include a second doped region 2004 formed between the first doped region 2006 and the dopant layer 2010. The second doped region 2004 may include or be formed from a drift region. The second doped region 2004 may include a doping type (second doping type) different from the dopant layer 2010, e.g. a dopant having the second doping type. The second doped region 2004 may include an epitaxial formed layer.

The electronic device 1300a may further include a further second contact pad 212b. The further second contact pad 212b may include or be formed from a gate contact pad 212b. The further second contact pad 212b may be formed electrical insulated from the second doped region 2004, e.g. by an electrically insulating layer formed between the further second contact pad 212b and the second doped region 2004. The further second contact pad 212b may include or be formed from a metallization layer.

Further, the electronic device 1300a may include a third doped region 2008. The third doped region 2008 may include or be formed from an emitter region. The third doped region 2008 may include (e.g. a dopant having) a doping type different from the dopant layer 2010, e.g. the second doping type. A dopant concentration of the third doped region 2008 may be greater than of the second doped region 2004.

Optionally, the electronic device 1300a may include a fourth doped region 2002 between the second doped region 2004 and the dopant layer 2010. The fourth doped region 2002 may include or be formed from a field stop region. The fourth doped region 2002 may include a dopant having a doping type different from the dopant layer 2010. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

The electronic device 1300a, e.g. at least one at least one electronic component 112, 112a, 112b, 112c (e.g. a semiconductor circuit element 112, 112a, 112b, 112c), may include or be formed from a transistor structure, e.g. a planar transistor structure (providing a vertical current flow). A transistor structure may include or be formed from a plurality of p-n junctions. A p-n junction may be formed by an interface of two doped regions having different doping types, e.g. an interface between at least one the following: the first doped region 2006 and the second doped region 2004; the first doped region 2006 and the third doped region 2008; the second doped region 2004 and the dopant layer 2010; the dopant layer 2010 and the fourth doped region 2002 (if present, e.g. in an IGBT).

According to various embodiments, the electronic device 1300a, e.g. at least one electronic component 112, 112a, 112b, 112c, may include or be formed from an insulated-gate bipolar transistor. Optionally, the electronic device 1300a may be formed without the dopant layer 2010.

Figure 13B:
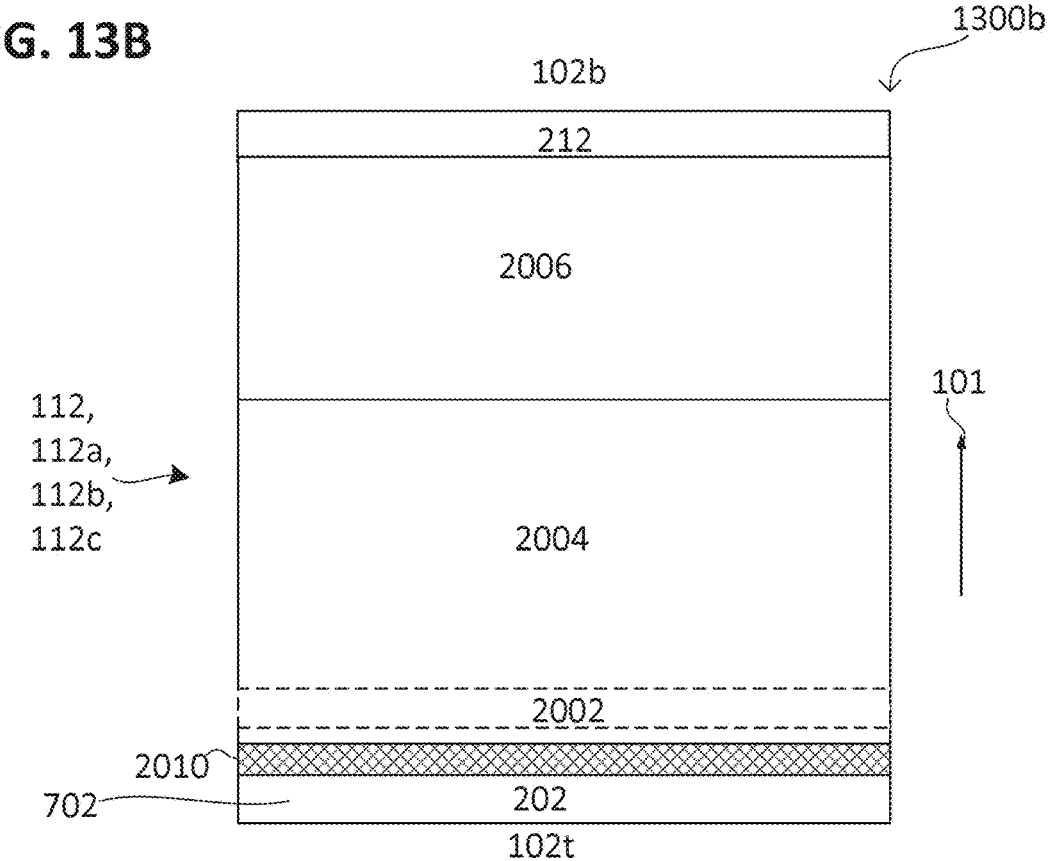

FIG. 13B shows an electronic device 1300b according to various embodiments, during processing in a method according to various embodiments in a schematic cross sectional view or side view, e.g. including at least one electronic component 112, 112a, 112b, 112c, e.g. providing a power electronic circuit structure.

The electronic device 1300b may include the dopant layer 2010 formed on the second side 102b. The dopant layer 2010 may include or be formed from a first doping type.

The electronic device 1300b may further include a first contact pad 202 electrical contacting the dopant layer 2010. The first contact pad 202 may include or be formed from an electrode contact pad. The first contact pad 202 may include or be formed from a metallization layer. The first contact pad 202 may substantially cover the dopant layer 2010.

Further, the electronic device 1300b may include a first doped region 2006. The first doped region 2006 may include or be formed from a first junction region. The first doped region 2006 may include a dopant having a doping type different from the dopant layer 2010 (in other words, the dopant of the dopant layer 2010), e.g. the second doping type. The electronic device 1300b may further include a second contact pad 212 electrical contacting the first doped region 2006. The second contact pad 212 may include or be formed from an electrode contact pad. The second contact pad 212a may include or be formed from a metallization layer. Further, the electronic device 1300b may include a second doped region 2004 formed between the first doped region 2006 and the dopant layer 2010. The second doped region 2004 may include or be formed from a second junction region. The second doped region 2004 may include a doping type equal to a doping type of the dopant layer 2010, e.g. a dopant having the first doping type.

Optionally, the electronic device 1300b may include a third doped region 2002 between the second doped region 2004 and the dopant layer 2010. The third doped region 2002 may include or be formed from a field stop region. The third doped region 2002 may include (e.g. a dopant having) a doping type equal to a doping type of the dopant layer 2010. The third doped region 2002 may include a dopant concentration higher than at least one of the first doped region 2006 and the second doped region 2004.

The electronic device 1300b, e.g. at least one electronic component 112, 112a, 112b, 112c, e.g. a power electronic circuit structure, may include or be formed from a diode structure, e.g. a planar diode structure (providing a vertical current flow). A diode structure may include or be formed from a p-n junction, e.g. formed by an interface of two doped regions having different doping types, e.g. an interface between the first doped region 2006 and the second doped region 2004.

Optionally, the electronic device 1300b may be formed without the dopant layer 2010.

Figure 14:
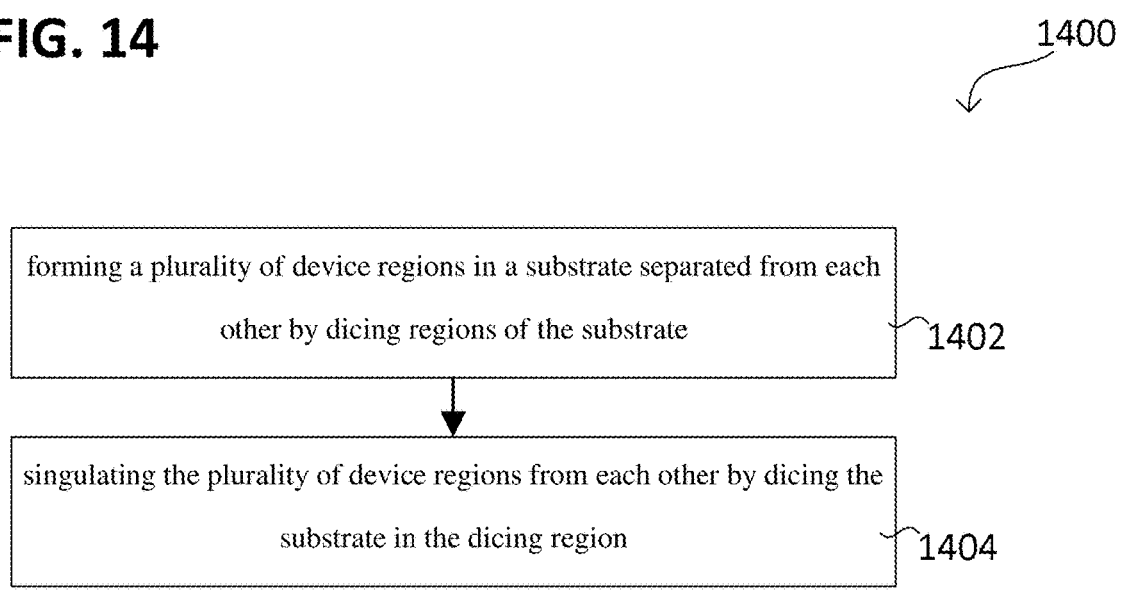
FIG. 14 shows a method according to various embodiments in a schematic flow diagram.

FIG. 14 shows a method 1400 according to various embodiments in a schematic flow diagram. The method 1400 may include in 1402 forming a plurality of device regions in a substrate separated from each other by dicing regions of the substrate. Further, the method 1400 may include in 1404 singulating the plurality of device regions from each other by dicing the substrate in the dicing region.

Optionally, the method may include forming a stabilizing structure in each device region of the plurality of device regions.

Figure 15:
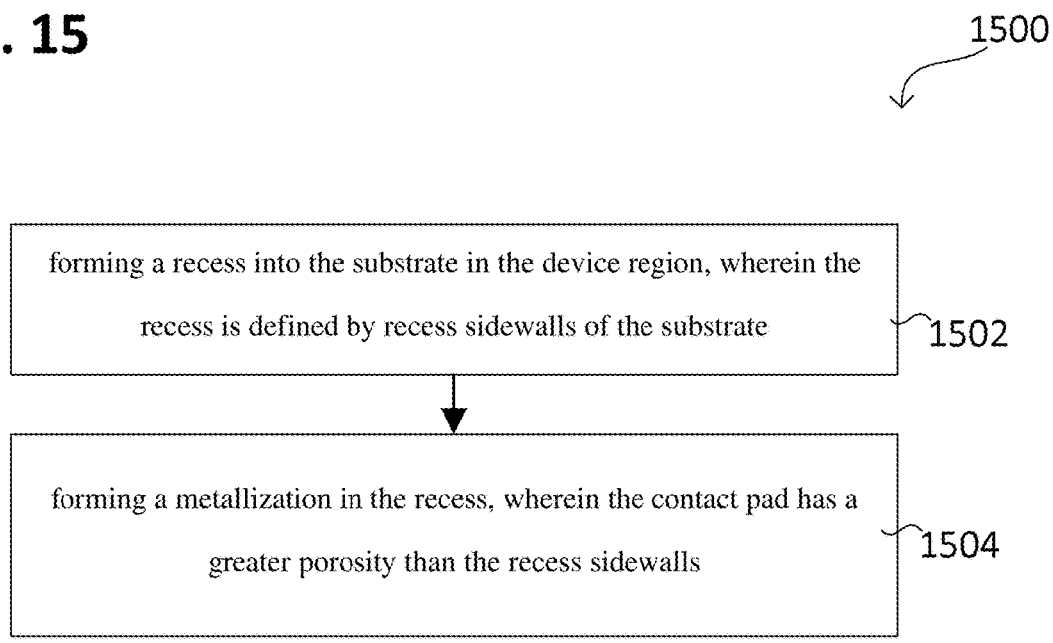
FIG. 15 shows a method according to various embodiments in a schematic flow diagram.

FIG. 15 shows a method 1500 according to various embodiments in a schematic flow diagram, e.g. for processing a device region, e.g. a device region of a plurality of device regions in a substrate. The substrate may include at least one semiconductor component (e.g. at least one electronic component).

The method 1500 may include in 1502 forming a recess into the substrate in the device region. The recess may be defined by recess sidewalls of the substrate. The method 1500 may include in 1504 forming a metallization (e.g. a contact pad) in the recess, e.g. to electrically connect the at least one semiconductor component (e.g. the at least one electronic component), wherein the metallization (e.g. the contact pad) has a greater porosity than the recess sidewalls.

The method 1500 may optionally include forming the at least one semiconductor component (e.g. the at least one electronic component) in the substrate, e.g. prior to forming the recess. The at least one semiconductor component (e.g. the at least one electronic component) may be formed in a process separate from forming the recess.

The metallization (e.g. the contact pad) may be proximate a first side of the substrate (or the respective device region). The at least one semiconductor component (e.g. the at least one electronic component) may be proximate a second side of the substrate (or the respective device region) opposite the first side. The at least one semiconductor component (e.g. the at least one electronic component) may include a first side facing the first side of the substrate (or the respective device region). The at least one semiconductor component (e.g. the at least one electronic component) may include a second side facing at least one of the second side of the substrate (or the respective device region), the recess and the metallization (e.g. the contact pad). The metallization (e.g. the contact pad) may electrically contact the at least one semiconductor component (e.g. the at least one electronic component), e.g. the first side of the at least one semiconductor component (e.g. the at least one electronic component). At least one further metallization (e.g. the further contact pad) may electrically contact the at least one semiconductor component (e.g. the at least one electronic component), e.g. the second side of the at least one semiconductor component (e.g. the at least one electronic component).

The method may optionally include disposing a solder material over the metallization (e.g. the contact pad) for electrically connecting the metallization (e.g. the contact pad). A surface of the metallization (e.g. the contact pad) facing the first side of the substrate (or the respective device region), in other words, opposite the at least one semiconductor component (e.g. the at least one electronic component) may be at least one of exposed or at least partially covered by a solder material.

Figure 16:
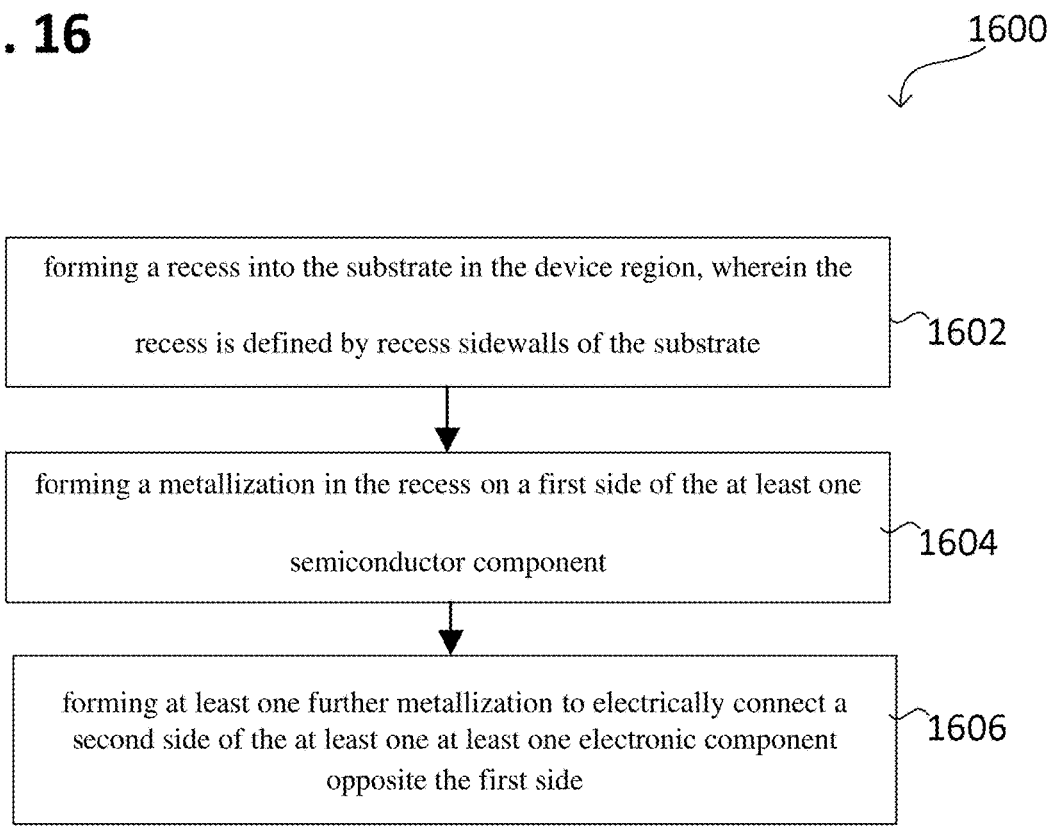
FIG. 16 shows a method according to various embodiments in a schematic flow diagram.

FIG. 16 shows a method 1600 according to various embodiments in a schematic flow diagram, e.g. for processing a device region, e.g. a device region of a plurality of device regions in a substrate. The method 1600 may include in 1602 forming a recess into the substrate in the device region, wherein the recess is defined by recess sidewalls of the substrate. The method 1600 may include in 1604 forming a metallization (e.g. a contact pad) in the recess on a first side of the at least one semiconductor component (e.g. the at least one electronic component), e.g. to electrically connect a first side of the at least one semiconductor component (e.g. the at least one electronic component). The method 1600 may include in 1606 forming at least one further metallization (e.g. at least one further contact pad) to electrically connect a second side of the at least one semiconductor component (e.g. the at least one electronic component) opposite the first side. The metallization (e.g. the contact pad) may have a greater porosity than at least one of the recess sidewalls and the at least one further metallization (e.g. the further contact pad).

FIGS. 17A and 17B respectively show an electronic device according to various embodiments, during processing in a method according to various embodiments in a schematic cross sectional view or top view (viewed parallel to direction 101).

As illustrated in view 1700a, the substrate 102 may include plurality of device regions 106a, 106b, 106c, 106a', 106b', 106c' and dicing regions 108 between them. Adjacent device regions of the plurality of device regions 106a, 106b, 106c, 106a', 106b', 106c' may be separated by a dicing region 108.

In each device region of the plurality of device regions 106a, 106b, 106c, 106a', 106b', 106c' at least one recess 102r may be formed. A distance 1702 between the recesses of adjacent device regions of the plurality of device regions 106a, 106b, 106c, 106a', 106b', 106c' may be less than an extension 1704 of each of the recesses 102r along the distance (also referred to as lateral extension 1704), e.g. perpendicular to direction 101 (see also FIG. 1B).

The extension 1704 of each of the recesses 102r may be greater than about 50% of an extension 106l of the singulated device region 106a, 106b, 106c (also referred to as device extension, corresponding to a distance of adjacent dicing regions 108) parallel thereto, e.g. greater than about 60% of the device extension 106l, e.g. greater than about 70% of the device extension 106l, e.g. greater than about 80% of the device extension 106l, e.g. greater than about 90% of the device extension 106l, e.g. greater than about 95% of the device extension 106l.

In each recess 102r of the plurality of device regions 106a, 106b, 106c, 106a', 106b', 106c' a metallization 202 (e.g. a contact pad 202) may be formed. The metallization 202 (e.g. the contact pad 202) may include a porosity greater than the recess sidewalls 110 defining the recess 102r.

The recess sidewalls 110 may surround the recess 102r of each device region plurality of device regions 106a, 106b, 106c, 106a', 106b', 106c'. The recess sidewalls 110 may be disposed between the recess 102r and the dicing regions 108. The dicing regions 108 may extend between recess sidewalls 110 of adjacent device regions of the plurality of device regions 106a, 106b, 106c, 106a', 106b', 106c'. The recess sidewalls 110 may form a stabilizing frame around the recess 102r.

As illustrated in view 1700b, the plurality of device regions 106a, 106b, 106c, 106a', 106b', 106c' may be singulated from each other by dicing the substrate 102 in the dicing regions 108. Dicing the substrate 102 may be configured such that the recess sidewalls 110 defining the recess 102r of each device region of the plurality of device regions 106a, 106b, 106c, 106a', 106b', 106c' may be un-diced.

FIG. 18A to 18C respectively show an electronic device according to various embodiments, during processing in a method according to various embodiments in a schematic cross sectional view or side view.

Forming the recess 102r in each device region of the plurality of device regions 106a, 106b, 106c may be configured such that a cross section (perpendicular to direction 101) of the recess changes into direction 101. Direction 101 may point towards the at least one semiconductor component 112 (e.g. the at least one electronic component 112) (see FIG. 1C).

As illustrated in view 1800*a*, forming the recess 102*r* may be configured such that the cross section of the recess 102*r* increases into direction 101.

As illustrated in view 1800*b*, forming the recess 102*r* may be configured such that the cross section of the recess 102*r* decreases into direction 101.

As illustrated in view 1800*c*, forming the recess 102*r* may be configured such that the recess sidewalls 110 includes at least one step 110*s*. The at least one step 110*s* may surround the recess 102*r*. If the recess sidewalls 110 include at least one step 110*s* forming the recess 102*r* may be configured such that the cross section of the recess 102*r* decreases or increases into direction 101

According to various embodiments, a method for processing a device region 106*a*, 106*b*, 106*c* may include: forming a recesses 102*r* in a substrate 102 from a first side 102*t* of the substrate 102; forming at least one doped region (e.g. for forming at least one semiconductor component 112, 112*a*, 112*b*, 112*c* (e.g. at least one electronic component 112, 112*a*, 112*b*, 112*c*) in the device region 106*a*, 106*b*, 106*c*) from a second side 102*b* of the device region 106*a*, 106*b*, 106*c* opposite the first side 102*t*. Alternatively, the at least one doped region (e.g. the at least one semiconductor component 112, 112*a*, 112*b*, 112*c* (e.g. the at least one electronic component 112, 112*a*, 112*b*, 112*c*)) may be provided with the substrate 102.

The method for processing a device region 106*a*, 106*b*, 106*c* may further include: forming a metallization 202 (e.g. a contact pad 202) at least partially filling the recess 102*r* (e.g. electrically connected to the semiconductor component 112, 112*a*, 112*b*, 112*c* (e.g. the electronic component 112, 112*a*, 112*b*, 112*c*)). The metallization 202 (e.g. the contact pad 202) may be electrically conductive or at least include an electrically conductive material, e.g. a metal.

Further processing of the device region 106*a*, 106*b*, 106*c* may include singulating the device region 106*a*, 106*b*, 106*c* from a substrate 102 be dicing the substrate 102 in dicing regions 108 of the substrate 102. The device region 106*a*, 106*b*, 106*c* may be surrounded by dicing regions of the substrate 102

The metallization 202 (e.g. the contact pad 202) may have a greater porosity than a portion of the substrate 102 surrounding the recess 102*r*. Alternatively or additionally, the metallization 202 (e.g. the contact pad 202) may have a greater porosity than the dicing region 108 of the substrate 102. An integrated power electronic may include or be formed from the at least one semiconductor component 112, 112*a*, 112*b*, 112*c* (e.g. the at least one electronic component 112, 112*a*, 112*b*, 112*c*).

Figure 19A:
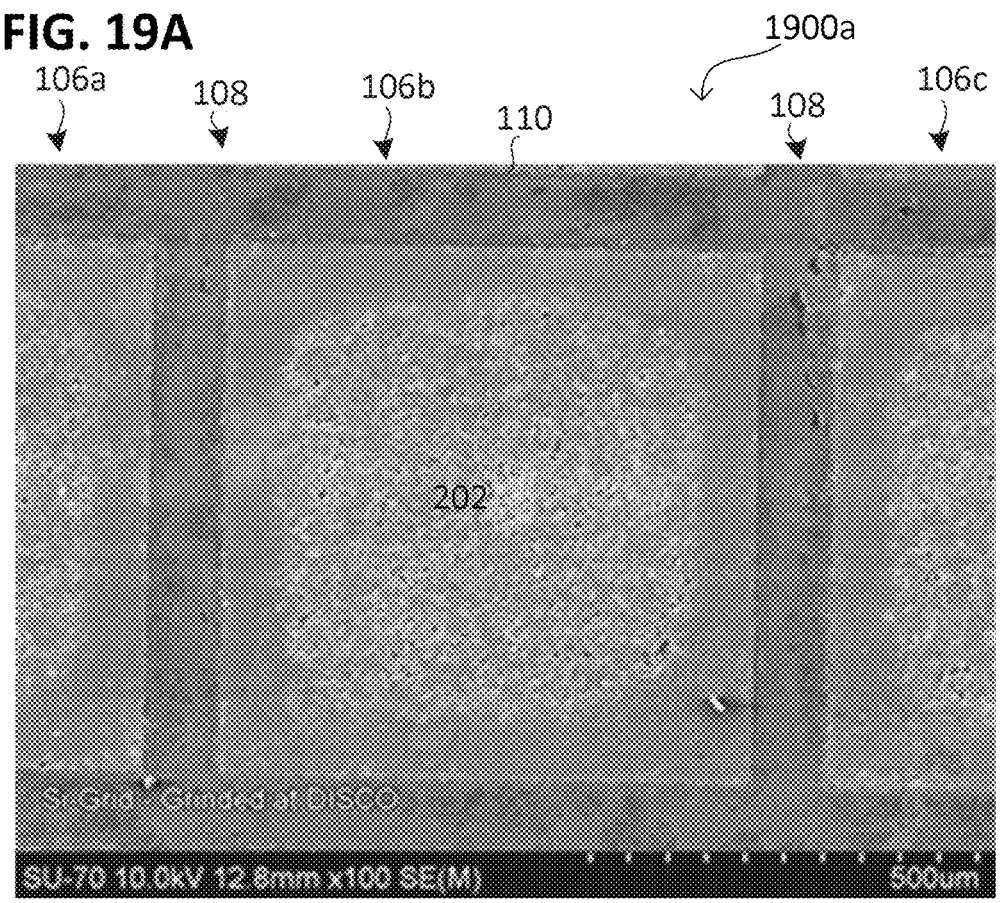
FIG. 19A shows a contact pad according to various embodiments during processing in a method according to various embodiments in a schematic top view.
Figure 19B:
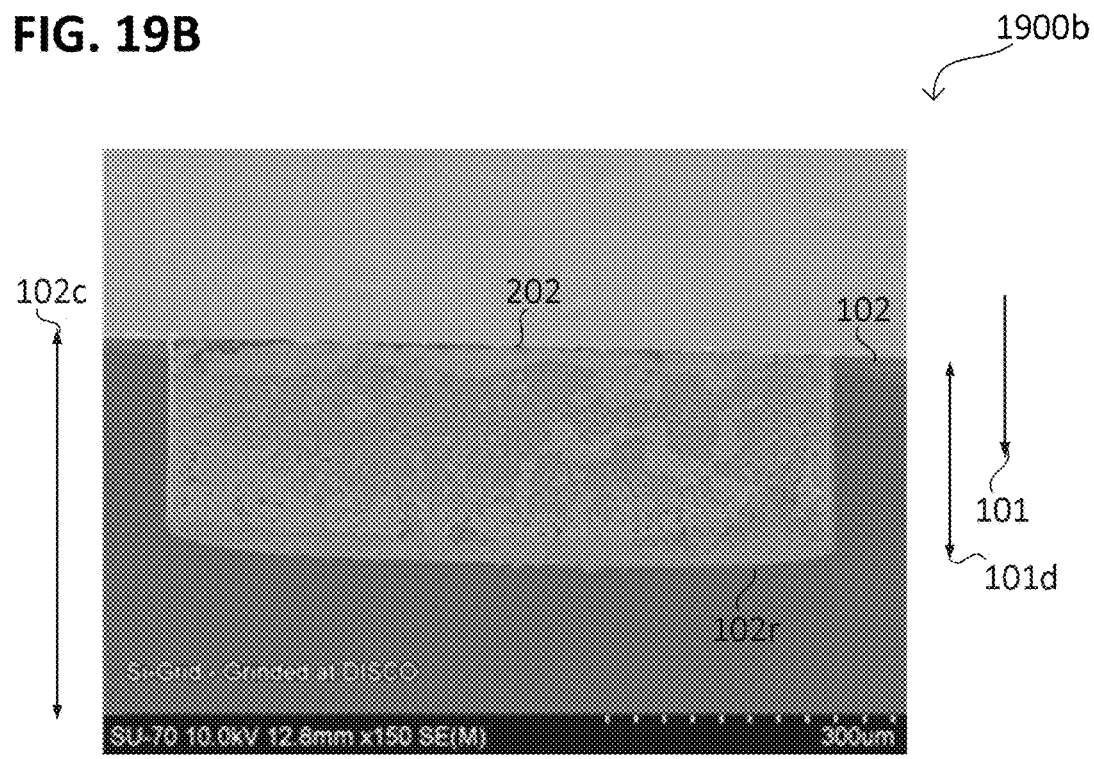
FIG. 19B shows the contact pad of FIG. 19A in a schematic cross sectional view or side view.

FIG. 19A shows a metallization 202 (e.g. a contact pad 202) according to various embodiments, during processing in a method according to various embodiments in a schematic top view 1900*a* and FIG. 19B the metallization 202 (e.g. the contact pad 202) of FIG. 19A in a schematic cross sectional view 1900*b* or side view 1900*b*.

By way of example, a thickness 102*c* of the substrate may be about 400 µm. An extension 101*d* along direction 101 of at least one of the recess 102*r* and the metallization 202 (e.g. the contact pad 202) may be about 200 µm. The substrate 102 may be covered (e.g. full area) by printed copper and tempered (annealed) at 400° C. for at least 3 hours. Subsequently, the copper may be partially removed by planarizing the metallization 202 (e.g. the contact pad 202) down to the material of the substrate 102.

Evidence of using a method or a device according to various embodiments, may be provided by a chemical analysis and/or physical analysis. By way of example, a cross section (e.g. as described herein) of the metallization 202 (e.g. the contact pad 202) may be analyzed. The cross section may be prepared by focused ion beam cutting (FIB-cut).

The presence (e.g. trace) of organic components (e.g. a solvent, a binder or a particle coating) may indicate the usage of a printing process (e.g. paste printing). The die-attach (e.g. by using solder paste) may be revealed by energy dispersive X-ray spectroscopy (EDX). The recess 102*r* and the recess sidewalls 110 (e.g. the stabilizing structure) may be revealed by scanning electron microscope (SEM).

Alternatively or additionally to a printing, the metallization 202 (e.g. the contact pad 202) may be formed using a plasma dust (plasma dust deposition). Plasma dust deposition may be more time intensive than printing. By way of example, printing may provide to fill the recess 102*r* within one or two deposition processes, wherein plasma dust deposition may only provide several micrometers (µm) of thickness per deposition process. The time required for forming the metallization 202 (e.g. the contact pad 202) may be much higher for plasma dust deposition compared to printing.

Compared to a pore-free metallization 202 (e.g. a pore-free contact pad), the metallization 202 (e.g. the contact pad 202) according to various embodiments may reduce production costs and/or reduce thermomechanical load (e.g. stress arising from thermal changes) in the chip. Therefore, the metallization 202 (e.g. the contact pad 202) according to various embodiments may increase the stability of the chip. The metallization 202 (e.g. the contact pad 202) may reduce a risk of crack occurrence during back-end processing the chip, e.g. during chip packaging, during pick-up the chip (e.g. to release the chip from a substrate carrier, e.g. a dicing foil). This may increase the yield of operable and readily processed chips and increases the reliability of the readily processed chips.

Further, various embodiments will be described in the following.

1. A method for processing a substrate, the method including:
    processing a plurality of device regions in a substrate separated from each other by dicing regions, each device region including at least one semiconductor component, wherein processing each device region of the plurality of device regions includes:
        forming a recess into the substrate in the device region, wherein the recess is defined by recess sidewalls of the substrate, wherein the recess sidewalls are arranged in the device region;
        forming a metallization in the recess for mechanical stabilization, wherein the metallization has a greater porosity than the recess sidewalls; and
    singulating the plurality of device regions from each other by dicing the substrate in the dicing region.
2. A method for processing a device region including at least one semiconductor component, the method including:
    forming a recess into the device region, wherein the recess is defined by recess sidewalls of the device region; and
    forming a metallization in the recess for mechanical stabilization, wherein the metallization has a greater porosity than the recess sidewalls.

3. The method of clause 1 or 2,
wherein the at least one semiconductor component is configured to transform between electrical energy and at least one of electrical energy, mechanical energy and optical energy.

4. The method of one of the clauses 1 to 3,
wherein the at least one semiconductor component includes or is formed from at least one of:
an electrical component;
an electromechanical component;
an optoelectrical component; and/or
an optoelectromechanical component.

5. The method of one of the clauses 1 to 4,
wherein the metallization includes or is formed from a contact pad to electrically connect the at least one semiconductor component.

6. A method for processing a substrate, the method including:
processing a plurality of device regions in a substrate separated from each other by dicing regions, each device region including at least one electronic component, wherein processing each device region of the plurality of device regions includes:
forming a recess into the substrate in the device region, wherein the recess is defined by recess sidewalls of the substrate, wherein the recess sidewalls are arranged in the device region;
forming a contact pad in the recess to electrically connect the at least one electronic component, wherein the contact pad has a greater porosity than the recess sidewalls; and
singulating the plurality of device regions from each other by dicing the substrate in the dicing region.

7. A method for processing a device region including at least one electronic component, the method including:
forming a recess into the device region, wherein the recess is defined by recess sidewalls of the device region; and
forming a contact pad in the recess to electrically connect the at least one semiconductor component (respectively the at least one electronic component), wherein the contact pad has a greater porosity than the recess sidewalls.

8. The method of one of the clauses 1 to 7,
wherein the recess extends from a first side into the device region and the at least one semiconductor component (respectively the at least one electronic component) extends from the recess to a second side of the device region opposite the first side.

9. The method of one of the clauses 1 to 8,
wherein the at least one semiconductor component (respectively the at least one electronic component) includes at least one power electronic component or forms a power electronic circuit structure.

10. The method of one of the clauses 1 to 9,
forming at least one further metallization (respectively at least one further contact pad) to electrically connect the at least one semiconductor component (respectively the at least one electronic component) opposite the recess.

11. A method for processing a substrate, the method including:
processing a plurality of device regions in a substrate separated from each other by dicing regions, each device region including at least one power electronic component;
wherein processing each device region of the plurality of device regions includes:
forming a recess into the substrate in the device region, wherein the recess is defined by recess sidewalls of the substrate;
forming a contact pad in the recess to electrically connect a first side of the at least one power electronic component;
forming at least one further contact pad to electrically connect a second side of the at least one power electronic component opposite the first side;
wherein the contact pad has a greater porosity than at least one of the recess sidewalls or the at least one further contact pad; and singulating the plurality of device regions from each other by dicing the substrate in the dicing region.

12. The method of one of the clauses 1 to 11,
wherein the at least one electronic component is configured to provide a current flow parallel to a direction pointing from the first side to the second side.

13. The method of one of the clauses 1 to 12,
wherein a width (lateral extension) of the recess is greater than at least one of a distance of the recess from the dicing region, a depth (vertical extension) of the recess and a distance of the recesses from at least one an adjacent device region and an adjacent recess.

14. The method of one of the clauses 1 to 13,
wherein a depth (vertical extension) of the recess is greater than about half a thickness (vertical extension) of the at least one semiconductor component (respectively the at least one electronic component) and/or
wherein the recess extends more than 50% into at least one of the device region and the substrate.

15. The method of one of the clauses 1 to 14,
wherein the recess sidewalls form a stabilization frame having a greater thickness (vertical extension) than the at least one semiconductor component (respectively the at least one electronic component).

16. The method of clause 15,
wherein the stabilization frame surrounds the recess.

17. The method of one of the clauses 1 to 16,
wherein at least one of the stabilization frame and the recess sidewalls is/are surrounded by at least one of the dicing regions before singulating and by an exposed surface after singulating.

18. The method of one of the clauses 1 to 17, further including:
disposing a solder material over the metallization (respectively the contact pad).

19. The method of clause 18,
wherein the solder material at least partially fills at least one pore of the metallization (respectively the contact pad).

20. The method of one of the clauses 1 to 19, further including:
attaching a device region of the plurality of device regions to a carrier after singulating.

21. The method of one of the clauses 1 to 20,
wherein the at least one semiconductor component (respectively the at least one electronic component) includes at least one doped semiconductor material of the device region.

22. The method of one of the clauses 1 to 21,
    wherein the at least one semiconductor component (respectively the at least one electronic component) includes at least one p-n-junction in the device region.
23. The method of one of the clauses 1 to 22,
    wherein forming the metallization (respectively the contact pad) includes disposing solid particles in the recess.
24. The method of one of the clauses 1 to 23,
    wherein forming the metallization (respectively the contact pad) includes disposing solid nano particles in the recess.
25. The method of one of the clauses 1 to 24,
    wherein forming the metallization (respectively the contact pad) includes at least one of printing, dispenser deposition, plasma dust deposition, and electrochemical deposition.
26. The method of clause 25,
    wherein printing includes or is formed from at least one of screen printing, stencil printing, and ink-jet printing.
27. The method of one of the clauses 1 to 26,
    wherein forming the metallization (respectively the contact pad) includes at least one of a sintering process and a tempering process.
28. The method of clause 27,
    wherein a volume of the metallization (respectively the contact pad) is reduced during at least one of the sintering process and the tempering process.
29. The method of one of the clauses 1 to 28,
    wherein forming the metallization (respectively the contact pad) includes disposing a first chemical composition at least one of in and over the recess and transforming the first composition into a second chemical composition different form the first chemical composition by heating the metallization (respectively the contact pad).
30. The method of clause 29,
    wherein a volume of the metallization (respectively the contact pad) is reduced by transforming the first chemical composition into a second chemical composition.
31. The method of clause 29 or 30,
    wherein the first chemical composition at least one of includes a liquid component and is paste-like.
32. The method of one of the clauses 1 to 31,
    wherein at least one of the second chemical composition and the metallization (respectively the contact pad) is at least one of metal-like and porous.
33. The method of one of the clauses 1 to 32,
    wherein at least one of the second chemical composition and the metallization (respectively the contact pad) includes or is formed from at least one of a solid material having an electrical conductivity more than about $10^6$ Sievert per meter, a solid material having a thermal conductivity more than about 150 Watts per meter and Kelvin, and a porous metal.
34. The method of one of the clauses 1 to 33,
    wherein a concentration of at least one of a polymer, an organic material, a non-solid material and a liquid material in the metallization (respectively the contact pad) is reduced by at least one of heating the metallization (respectively the contact pad) and transforming the first chemical composition into a second chemical composition.
35. The method of one of the clauses 1 to 34,
    wherein forming the metallization (respectively the contact pad) composition is configured such that a volume of the metallization (respectively the contact pad) after at least one of changing a chemical composition of the metallization (respectively the contact pad) and heating the metallization (respectively the contact pad) is substantially equal to a volume of the recess.
36. The method of one of the clauses 1 to 35,
    wherein forming the metallization (respectively the contact pad) is configured such that a volume of the metallization (respectively the contact pad) before at least one of changing a chemical composition of the metallization (respectively the contact pad) and heating the metallization (respectively the contact pad) is greater than a volume of the recess.
37. The method of one of the clauses 1 to 36,
    wherein a volume of the metallization (respectively the contact pad) before at least one of changing a chemical composition of the metallization (respectively the contact pad) and heating the metallization (respectively the contact pad) is defined by a mask used for forming the metallization (respectively the contact pad).
38. The method of one of the clauses 1 to 37,
    wherein forming the metallization (respectively the contact pad) includes using a mask.
39. The method of one of the clauses 1 to 38,
    wherein at least one of a paste and solid particles of the metallization (respectively the contact pad) are disposed through a mask into the recess.
40. The method of one of the clauses 1 to 39,
    wherein forming the metallization (respectively the contact pad) includes disposing solid particles through a mask into the recess.
41. The method of one of the clauses 1 to 40,
    wherein forming the metallization (respectively the contact pad) includes disposing a paste including solid particles in the recess.
42. The method of one of the clauses 1 to 41,
    wherein forming the metallization (respectively the contact pad) includes planarizing the metallization (respectively the contact pad).
43. The method of one of the clauses 1 to 42,
    wherein forming the metallization (respectively the contact pad) includes removing material of the metallization (respectively the contact pad) protruding from the substrate.
44. The method of one of the clauses 1 to 43,
    wherein the recess sidewalls protrude from the metallization (respectively the contact pad).
45. The method of one of the clauses 1 to 44,
    wherein forming the metallization (respectively the contact pad) includes at least two deposition processes.
46. The method of clause 45,
    wherein in a first deposition processes of the at least two deposition processes a first portion of the metallization (respectively the contact pad) is formed and in a second deposition processes of the at least two deposition processes a second portion of the metallization (respectively the contact pad) is formed over the first portion of the metallization (respectively the contact pad), wherein the first deposition processes includes at least one of changing a chemical composition of the first portion of the metallization (respectively the contact pad) and heating the first portion of the metallization (respectively the contact pad).

47. The method of clause 45 or 46,
wherein the first deposition process of the at least two deposition processes fills the recess partially.

48. The method of one of the clauses 1 to 47,
wherein the metallization (respectively the contact pad) includes or a solid portion of the metallization (respectively the contact pad) is formed from an electrically conductive material.

49. The method of one of the clauses 1 to 48,
wherein the metallization (respectively the contact pad) includes or a solid portion of the metallization (respectively the contact pad) is formed from a metallic material.

50. The method of one of the clauses 1 to 49,
wherein the metallization (respectively the contact pad) includes or a solid portion of the metallization (respectively the contact pad) is formed from at least one of silver, nickel, gold and copper.

51. The method of one of the clauses 1 to 50,
wherein the metallization (respectively the contact pad) includes a pore network of at least partially interconnected pores.

52. The method of one of the clauses 1 to 51,
wherein the metallization (respectively the contact pad) includes a porous structure.

53. The method of one of the clauses 1 to 52,
wherein the metallization (respectively the contact pad) includes a porous metal.

54. The method of one of the clauses 1 to 53, further including:
forming a barrier layer between the metallization (respectively the contact pad) and the at least one semiconductor component (respectively the at least one electronic component).

55. The method of one of the clauses 1 to 54, further including:
forming a barrier layer at least partially lining the recess.

56. The method of one of the clauses 1 to 55, further including:
forming an adhesion layer between the metallization (respectively the contact pad) and the at least one semiconductor component (respectively the at least one electronic component).

57. The method of one of the clauses 1 to 56, further including
forming an adhesion layer at least partially lining the recess.

58. The method of one of the clauses 54 to 57,
wherein the metallization (respectively the contact pad) is formed at least one of over and in contact with at least one of the adhesion layer and the barrier layer.

59. The method of one of the clauses 1 to 58,
wherein a porosity of the metallization (respectively the contact pad) is in the range from about 10% to about 90%.

60. The method of one of the clauses 1 to 59,
wherein forming the metallization (respectively the contact pad) includes heating the metallization (respectively the contact pad) to a temperature in the range from about 20% to about 90% of the melting temperature of a solid material of the metallization (respectively the contact pad).

61. The method of one of the clauses 1 to 60,
wherein forming the metallization (respectively the contact pad) includes heating the metallization (respectively the contact pad) to a temperature less than the melting temperature of a solid material of the metallization (respectively the contact pad).

62. The method of one of the clauses 1 to 61,
wherein forming the metallization (respectively the contact pad) includes heating the metallization (respectively the contact pad) to a sintering temperature of a solid material of the metallization (respectively the contact pad).

63. The method of one of the clauses 1 to 62,
wherein forming the metallization (respectively the contact pad) includes heating the metallization (respectively the contact pad) to a temperature of greater than at least one of an evaporation temperature and a decomposition temperature of a non-solid material of the metallization (respectively the contact pad).

64. The method of one of the clauses 1 to 63,
wherein forming the metallization (respectively the contact pad) includes a thermochemical process.

65. The method of one of the clauses 1 to 64,
wherein forming the metallization (respectively the contact pad) includes using an etchant at least one of removing or decomposing a non-solid material of the metallization (respectively the contact pad).

66. The method of one of the clauses 1 to 65,
wherein the metallization (respectively the contact pad) is at least one of formed and heated in a reductive atmosphere.

67. The method of one of the clauses 1 to 66,
wherein at least one of the substrate or the device region is adhered to a carrier during at least of forming the metallization (respectively the contact pad), forming the recess and singulating the device region.

68. The method of one of the clauses 1 to 67, further including:
forming an buried layer in the device region, wherein forming the recess stops at the buried layer.

69. The method of clause 68,
wherein the buried layer includes or is formed from at least one of: a doped layer, an etch stop layer, an oxide layer, a barrier layer, and a nitride layer.

70. The method of one of the clauses 1 to 69,
wherein forming the recess includes using an etching mask.

71. The method of one of the clauses 1 to 70,
wherein forming the recess includes or is achieved by etching.

72. The method of one of the clauses 1 to 71,
wherein forming the recess includes or is achieved by at least one of dry etching, electrochemical etching, and wet etching.

73. The method of clause 72,
wherein dry etching includes or is formed from at least one of plasma etching and ion etching.

74. The method of one of the clauses 1 to 73,
wherein forming the recess is configured such that a cross section of the recess changes into a direction towards the at least one semiconductor component (respectively the at least one electronic component).

75. The method of one of the clauses 1 to 74,
wherein the recess is formed by at least one of an anisotropic etching process and at least two etching processes differing from each other by an etching speed of the substrate.
76. The method of one of the clauses 1 to 75,
wherein forming the recess is configured such that a cross section of the recess increases into a direction towards the at least one semiconductor component (respectively the at least one electronic component).
77. The method of one of the clauses 1 to 76,
wherein forming the recess is configured such that a cross section of the recess decreases into a direction towards the at least one semiconductor component (respectively the at least one electronic component).
78. The method of one of the clauses 1 to 77,
wherein forming the recess is configured such that the sidewall includes at least one step.
79. An electronic device (e.g. a chip), including:
a recess defined by recess sidewalls of the electronic device;
an at least one semiconductor component;
a metallization at least partially filling the recess for mechanical stabilization;
wherein the metallization has a greater porosity than the recess sidewalls.
80. The electronic device of clause 79,
wherein the at least one semiconductor component is configured to transform between electrical energy and at least one of electrical energy, mechanical energy and optical energy.
81. The electronic device of clause 79 or 80,
wherein the at least one semiconductor component includes or is formed from at least one of:
an electrical component;
an electromechanical component;
an optoelectrical component; and/or
an optoelectromechanical component.
82. The electronic device of one of the clauses 79 to 81,
wherein the metallization includes or is formed from a contact pad to electrically connect the at least one semiconductor component.
83. An electronic device (e.g. a chip), including:
a recess defined by recess sidewalls of the electronic device;
an at least one electronic component;
a contact pad at least partially filling the recess and electrically connected with the at least one electronic component;
wherein the contact pad has a greater porosity than the recess sidewalls.
84. The electronic device of one of the clauses 79 to 83,
wherein the recess extends from a first side into the device region and at least one semiconductor component (respectively the at least one electronic component) extends from the recess to a second side of the device region opposite the first side.
85. The electronic device of one of the clauses 79 to 84,
wherein the at least one semiconductor component (respectively the at least one electronic component) includes at least one power electronic component or forms a power electronic circuit structure.
86. The electronic device of one of the clauses 79 to 85, further including:
at least one further metallization (respectively at least one further contact pad) electrically connected with the at least one semiconductor component (respectively the at least one electronic component) opposite the recess.
87. An electronic device, including:
a recess defined by recess sidewalls of the electronic device;
at least one power electronic component;
a contact pad at least partially filling the recess and electrically connected with a first side of the at least one power electronic component;
a further contact pad electrically connected with a second side of the at least one power electronic component opposite the first side;
wherein the contact pad has a greater porosity than at least one of the recess sidewalls or the at least one further contact pad.
88. The electronic device of one of the clauses 79 to 87,
wherein the at least one semiconductor component (respectively the at least one electronic component) is configured to provide a current flow parallel to a direction pointing from the first side to the second side.
89. The electronic device of one of the clauses 79 to 88,
wherein a width (lateral extension) of the recess is greater than at least one of a distance of the recess from a rim of the electronic device, a depth (vertical extension) and a width (lateral extension) of the recess sidewalls.
90. The electronic device of one of the clauses 79 to 89,
wherein a depth (vertical extension) of the recess is greater than about half a thickness (vertical extension) of the at least one semiconductor component (respectively the at least one electronic component) and/or
wherein the recess extends more than 50% into the electronic device.
91. The electronic device of one of the clauses 79 to 90,
wherein the recess sidewalls form a stabilization frame having a greater thickness (vertical extension) than the at least one semiconductor component (respectively the at least one electronic component).
92. The electronic device of clause 91,
wherein the stabilization frame surrounds the recess at least partially.
93. The electronic device of one of the clauses 91 or 92,
wherein the stabilization frame is surrounded by an exposed surface of the electronic device.
94. The electronic device of clause 79 to 93, further including:
a solder material disposed at least one of in and over the metallization (respectively the contact pad).
95. The electronic device of clause 94,
wherein the solder material at least partially fills pores of the metallization (respectively the contact pad).
96. The electronic device of one of the clauses 79 to 95, further including:
at least one further metallization (respectively the at least one further contact pad) electrically connected with the second side of the at least one semiconductor component (respectively the at least one electronic component).
97. The electronic device of one of the clauses 79 to 96,
wherein the at least one semiconductor component (respectively the at least one electronic component) includes at least one doped semiconductor material of the device region.

98. The electronic device of one of the clauses 79 to 97,
wherein the at least one semiconductor component (respectively the at least one electronic component) includes a at least one p-n-junction.
99. The electronic device of one of the clauses 79 to 98, wherein the metallization (respectively the contact pad) includes or is formed from sintered solid particles.
100. The electronic device of one of the clauses 79 to 99, wherein the metallization (respectively the contact pad) includes or is formed from sintered solid nano particles.
101. The electronic device of one of the clauses 79 to 100, wherein metallization (respectively the contact pad) includes a porous structure.
102. The electronic device of one of the clauses 79 to 101, wherein the metallization (respectively the contact pad) is substantially free of at least one of a polymer, an organic material, a non-solid material and a liquid material.
103. The electronic device of one of the clauses 79 to 102, wherein the metallization (respectively the contact pad) is at least one of metal-like and porous.
104. The electronic device of one of the clauses 79 to 103, wherein the metallization (respectively the contact pad) includes or is formed from at least one of a solid material having an electrical conductivity more than about $10^6$ Sievert per meter, a solid material having a thermal conductivity more than about 150 Watts per meter and Kelvin, and a porous metal.
105. The electronic device of one of the clauses 79 to 104, wherein the metallization (respectively the contact pad) is at least one of planarized or aligned with a surface of the electronic device on the first side.
106. The electronic device of one of the clauses 79 to 105, wherein the metallization (respectively the contact pad) protrudes from the sidewall.
107. The electronic device of one of the clauses 79 to 106, wherein the sidewall protrudes from the metallization (respectively the contact pad).
108. The electronic device of one of the clauses 79 to 107, wherein the metallization (respectively the contact pad) includes or a solid portion of the metallization (respectively the contact pad) is formed from an electrically conductive material
109. The electronic device of one of the clauses 79 to 108, wherein the metallization (respectively the contact pad) includes or a solid portion of the metallization (respectively the contact pad) is formed from a metallic material.
110. The electronic device of one of the clauses 79 to 109, wherein the metallization (respectively the contact pad) includes or a solid portion of the metallization (respectively the contact pad) is formed at least one of silver, nickel, gold, copper.
111. The electronic device of one of the clauses 79 to 110, further including:
a barrier layer formed between the metallization (respectively the contact pad) and the at least one semiconductor component (respectively the at least one electronic component).
112. The electronic device of one of the clauses 79 to 111, further including:
a barrier layer at least partially lining the recess.
113. The electronic device of one of the clauses 79 to 112, further including:
an adhesion layer formed between the metallization (respectively the contact pad) and the at least one semiconductor component (respectively the at least one electronic component).
114. The electronic device of one of the clauses 79 to 113, further including:
an adhesion layer at least partially lining the recess.
115. The electronic device of one of the clauses 79 to 114, wherein the metallization (respectively the contact pad) is formed at least one of over and in contact with at least one of the adhesion layer or the barrier layer.
116. The electronic device of one of the clauses 79 to 115, wherein a porosity of the metallization (respectively the contact pad) is in the range from about 10% to about 90%.
117. The electronic device of one of the clauses 79 to 116, wherein the recess sidewalls surrounds the recess at least partially.
118. The electronic device of one of the clauses 79 to 117, further including:
a buried stop layer formed in the device region, wherein the recess extends to the buried layer.
119. The electronic device of clause 118,
wherein the buried layer includes or is formed from at least one of: a doped layer, a barrier layer, an etch stop layer, an oxide layer and a nitride layer.
120. The electronic device of one of the clauses 79 to 119, wherein a cross section of the recess changes into a direction towards the at least one semiconductor component (respectively the at least one electronic component).
121. The electronic device of one of the clauses 79 to 120, wherein a cross section of the recess increases into a direction towards the at least one semiconductor component (respectively the at least one electronic component).
122. The electronic device of one of the clauses 79 to 121, wherein a cross section of the recess decreases into a direction towards the at least one semiconductor component (respectively the at least one electronic component).
123. The electronic device of one of the clauses 79 to 122, wherein the sidewall is stepped.
124. The electronic device of one of the clauses 79 to 123, wherein the electronic device is a chip.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A method for processing a semiconductor substrate, the method comprising:
processing a plurality of device regions in a semiconductor substrate laterally separated from each other by dicing regions, each device region comprising at least one electronic component, wherein processing each device region of the plurality of device regions comprises:
forming a recess into the semiconductor substrate in the device region directly over the at least one electronic component, wherein the recess comprises vertical recess sidewalls of the semiconductor substrate and extends into the semiconductor substrate towards the at least one electronic component, wherein the recess sidewalls are arranged in the device region;

forming a contact pad in the recess that is directly over the at least one electronic component to electrically connect the at least one electronic component, wherein the contact pad has a greater porosity than the recess sidewalls; and singulating the plurality of device regions from each other by dicing the semiconductor substrate in the dicing region.

2. The method of claim 1,
wherein the at least one electronic component includes at least one power electronic component.

3. The method of claim 1,
forming at least one further contact pad to electrically connect the at least one electronic component opposite the recess.

4. The method of claim 1,
wherein a depth of the recess is greater than half a thickness of the at least one electronic component.

5. The method of claim 1, further comprising:
disposing a solder material over the contact pad.

6. The method of claim 1,
wherein forming the contact pad comprises disposing solid particles in the recess.

7. The method of claim 1,
wherein forming the contact pad comprises at least one of printing, dispenser deposition, plasma dust deposition, and electrochemical deposition.

8. The method of claim 1,
wherein forming the contact pad comprises using a mask.

9. The method of claim 1,
wherein forming the contact pad comprises planarizing the contact pad.

10. The method of claim 1,
wherein the contact pad comprises or a solid portion of the contact pad is formed from an electrically conductive material.

11. The method of claim 1,
wherein the contact pad comprises or a solid portion of the contact pad is formed from at least one of silver, nickel, gold and copper.

12. The method of claim 1,
wherein a porosity of the contact pad is in the range from 10% to 90%.

13. The method of claim 1,
wherein forming the contact pad comprises etching and heating.

14. The method of claim 1,
wherein forming the recess is configured such that a cross section of the recess changes into a direction towards the at least one electronic component.

15. The method of claim 1,
wherein a width of the recess is greater than a distance of the recess from the dicing region.

16. The method of claim 1,
wherein the contact pad has the greater porosity than the at least one of the recess sidewalls, when the singulating of the plurality of device regions from each other is conducted.

17. The method of claim 6,
wherein, when the solid particles are disposed in the recess, the solid particles comprise electrically conductive particles and/or are dispersed in a non-solid material.

18. The method of claim 1,
wherein forming the contact pad in the recess includes heating the contact pad to or above an evaporation or decomposition temperature of a non-solid material of the contact pad.

19. A method for processing a semiconductor substrate, the method comprising:

processing a plurality of device regions in a semiconductor substrate laterally separated from each other by dicing regions, each device region comprising at least one semiconductor component, wherein processing each device region of the plurality of device regions comprises:

forming a recess into the semiconductor substrate in the device region directly over the at least one semiconductor component, wherein the recess comprises vertical recess sidewalls of the semiconductor substrate and extends into the semiconductor substrate towards the at least one semiconductor component, wherein the recess sidewalls are arranged in the device region;

forming a metallization in the recess that is directly over the at least one semiconductor component for mechanical stabilization, wherein the metallization has a greater porosity than the recess sidewalls; and singulating the plurality of device regions from each other by dicing the semiconductor substrate in the dicing region.

20. A method for processing a substrate, the method comprising:

processing a plurality of device regions in a substrate laterally separated from each other by dicing regions, each device region comprising at least one electronic component, wherein processing each device region of the plurality of device regions comprises:

forming a recess into the substrate in the device region directly over the at least one electronic component, wherein the recess comprises vertical recess sidewalls of the substrate and extends into the substrate towards the at least one electronic component, wherein the recess sidewalls are arranged in the device region;

forming a contact pad in the recess that is directly over the at least one electronic component to electrically connect the at least one electronic component, wherein the contact pad has a greater porosity than the recess sidewalls; and singulating the plurality of device regions from each other by dicing the substrate in the dicing region;

wherein the recess sidewalls comprise a semiconductor material and a greater hardness than the contact pad.

* * * * *